(12) United States Patent
Akagi et al.

(10) Patent No.: US 9,478,621 B2
(45) Date of Patent: Oct. 25, 2016

(54) SEMICONDUCTOR DEVICE

(75) Inventors: Nozomu Akagi, Nukata-gun (JP); Yuma Kagata, Kariya (JP); Makoto Kuwahara, Nagoya (JP)

(73) Assignee: DENSO CORPORATION, Kariya (JP)

( * ) Notice: Subject to any disclaimer, the term of this patent is extended or adjusted under 35 U.S.C. 154(b) by 176 days.

(21) Appl. No.: 14/238,915

(22) PCT Filed: Sep. 4, 2012

(86) PCT No.: PCT/JP2012/005577
§ 371 (c)(1),
(2), (4) Date: Feb. 14, 2014

(87) PCT Pub. No.: WO2013/046544
PCT Pub. Date: Apr. 4, 2013

(65) Prior Publication Data
US 2014/0151785 A1   Jun. 5, 2014

(30) Foreign Application Priority Data

Sep. 27, 2011 (JP) ................ 2011-210690
Dec. 1, 2011 (JP) ................ 2011-263799
Aug. 10, 2012 (JP) ................ 2012-178674
Aug. 10, 2012 (JP) ................ 2012-178676

(51) Int. Cl.
*H01L 29/66* (2006.01)
*H01L 29/40* (2006.01)
(Continued)

(52) U.S. Cl.
CPC ......... *H01L 29/405* (2013.01); *H01L 29/0634* (2013.01); *H01L 29/404* (2013.01);
(Continued)

(58) Field of Classification Search
CPC ............. H01L 29/404; H01L 29/7803; H01L 29/7808; H01L 29/405; H01L 29/7813; H01L 29/0634; H01L 29/7811; H01L 29/0878

USPC .......................................................... 257/329
See application file for complete search history.

(56) References Cited

U.S. PATENT DOCUMENTS 6,512,268 B1    1/2003  Ueno
2003/0222327 A1   12/2003  Yamaguchi et al.
(Continued)

FOREIGN PATENT DOCUMENTS

JP    2003-204065 A    7/2003
JP    2006-114866 A    4/2006

OTHER PUBLICATIONS

Office Action mailed Jun. 3, 2014 issued in corresponding JP patent application No. 2012-178674 (and English translation).
(Continued)

*Primary Examiner* — Vongsavanh Sengdara
(74) *Attorney, Agent, or Firm* — Posz Law Group, PLC

(57) ABSTRACT

The element electrodes of a semiconductor element are disposed in a cell region, while an outermost peripheral electrode electrically connected to a semiconductor substrate is disposed in a peripheral region. In the peripheral region, a second-conductivity-type layer is disposed above a super-junction structure. A potential division region is disposed above the second-conductivity-type layer to electrically connect the element electrodes and the outermost peripheral electrode and also divide the voltage between the element electrodes and the outermost peripheral electrode into a plurality of stages. A part of the potential division region overlaps the peripheral region when viewed from the thickness direction of the semiconductor substrate.

20 Claims, 24 Drawing Sheets

(51) Int. Cl.
*H01L 29/78* (2006.01)
*H01L 29/06* (2006.01)
*H01L 29/08* (2006.01)

(52) U.S. Cl.
CPC ....... *H01L29/7803* (2013.01); *H01L 29/7808* (2013.01); *H01L 29/7811* (2013.01); *H01L 29/7813* (2013.01); *H01L 29/0878* (2013.01)

(56) References Cited

U.S. PATENT DOCUMENTS

| | | |
|---|---|---|
| 2004/0245570 A1 | 12/2004 | Ninomiya |
| 2006/0006458 A1 | 1/2006 | Motai et al. |
| 2006/0043478 A1 | 3/2006 | Yamaguchi et al. |
| 2006/0043480 A1 | 3/2006 | Tsuchitani et al. |
| 2006/0151831 A1* | 7/2006 | Ninomiya ............ H01L 29/0634 257/330 |
| 2006/0231917 A1 | 10/2006 | Ono et al. |
| 2007/0029543 A1* | 2/2007 | Ninomiya ............ H01L 29/0634 257/25 |
| 2007/0272977 A1 | 11/2007 | Saito et al. |
| 2007/0272979 A1* | 11/2007 | Saito ................... H01L 29/0634 257/335 |
| 2008/0001217 A1 | 1/2008 | Kawashima |
| 2008/0173935 A1* | 7/2008 | Miyajima ............. H01L 29/866 257/328 |
| 2008/0179671 A1 | 7/2008 | Saito et al. |
| 2009/0079002 A1* | 3/2009 | Lee .................. H01L 29/66712 257/355 |
| 2009/0101974 A1 | 4/2009 | Saito et al. |
| 2009/0236697 A1 | 9/2009 | Ono et al. |
| 2010/0044788 A1 | 2/2010 | Hirler et al. |
| 2010/0187599 A1* | 7/2010 | Sasaki ................ H01L 29/0634 257/329 |
| 2010/0264489 A1 | 10/2010 | Ohta et al. |
| 2011/0115033 A1* | 5/2011 | Tamaki ............... H01L 29/7395 257/409 |
| 2011/0195563 A1 | 8/2011 | Okuno et al. |
| 2012/0061721 A1* | 3/2012 | Kimura ............... H01L 29/0634 257/133 |
| 2012/0112267 A1 | 5/2012 | Sasaki |
| 2012/0161231 A1* | 6/2012 | Tamaki .................. H01L 24/05 257/335 |
| 2012/0267707 A1 | 10/2012 | Sasaki |

OTHER PUBLICATIONS

Office Action mailed Jan. 27, 2015 issued in corresponding JP patent application No. 2012-178676 (and English translation).
International Search Report mailed Nov. 20, 2012 for the corresponding international application No. PCT/JP2012/005577 (with English translation).
Written Opinion mailed Nov. 20, 2012 for the corresponding international application No. PCT/JP2012/005577 (with English translation).
Office Action mailed Feb. 17, 2015 issued in corresponding JP patent application No. 2012-178674 (and English translation).
Chinese Office Action dated Jan. 22, 2016 in the corresponding CN application No. 201280047129.7(English translation attached).

* cited by examiner

IMPURITY CONCENTRATION

IMPURITY CONCENTRATION

ISOCONCENTRATION LINE

ISOCONCENTRATION LINE

ISO-EXCESS-CONCENTRATION LINE

ISO-EXCESS-CONCENTRATION LINE

SEMICONDUCTOR DEVICE

CROSS REFERENCE TO RELATED APPLICATION

The present application is a U.S. national stage application of International Patent Application No. PCT/JP2012/005577 filed on Sep. 4, 2012, and is based on Japanese Patent Application No. 2011-210690 filed on Sep. 27, 2011, Japanese Patent Application No. 2011-263799 filed on Dec. 1, 2011, Japanese Patent Application No. 2012-178676 filed on Aug. 10, 2012, and Japanese Patent Application No. 2012-178674 filed on Aug. 10, 2012, the contents of which are hereby incorporated by reference.

TECHNICAL FIELD

The present disclosure relates to a semiconductor device including a cell region and a peripheral region surrounding the cell region.

BACKGROUND ART

Patent Document 1 discloses a semiconductor device including a vertical semiconductor element having a super-junction (SJ) structure in which N-type columns and P-type columns are alternately and repeatedly formed in a striped shape in a drift layer. With the SJ structure, an electric current path in which an electric current easily flows is formed, resulting in a lower ON resistance. Also, with the SJ structure, the concentration of an electric field is avoided so that a high breakdown voltage is obtained. In other words, both of the high breakdown voltage and the low ON resistance are achieved.

The semiconductor device is provided with a structure in which, in a cell region where the vertical semiconductor element is formed, a charge balance is maintained such that the P-type columns and the N-type columns have equal impurity concentrations while, in a peripheral region surrounding the cell region, a difference is provided between the respective impurity concentrations of the P-type columns and the N-type columns. Specifically, with regard to the difference between the impurity amount in each of the P-type columns and the impurity amount in each of the N-type columns, the difference between the impurity amounts in the combination of the P-type column and the N-type column located on the outermost periphery of the peripheral region is adjusted to be smaller than the difference between the impurity amounts in another combination of the P-type column and the N-type column located in the peripheral region, while the difference between the impurity amounts in the combination of the P-type column and the N-type column located on the innermost periphery of the peripheral region is adjusted to be larger than the difference between the impurity amounts in a combination of the P-type column and the N-type column located in the cell region.

PRIOR ART DOCUMENTS

Patent Document

[Patent Document 1] JP-A-2006-73615

SUMMARY OF INVENTION

Problem to be Solved by the Invention

However, in the semiconductor device shown in Patent Document 1 mentioned above, in a direction from the innermost periphery to the outermost periphery of the peripheral region, a P-rich state where the impurity concentration of the P-type column is higher than the impurity concentration of the N-type column is encountered first and then, at a position closer to the outer periphery, an N-rich state where the impurity concentration of the N-type column is higher than the impurity concentration of the P-type column is encountered. When a P-rich region is formed and P-charges Qp become larger than N-charges to result in a positive charge imbalance (=P-Charges Qp−N-Charges Qn/N-Charges Qn), a depletion layer expands to a drain side (substrate bottom surface side) so that a breakdown occurs on the outermost periphery side. As a result, as can be seen from the relationship diagram between a charge imbalance and a breakdown voltage shown in FIG. 28, the breakdown voltage is lower on the outermost periphery side than in the cell region so that the peripheral region narrows a charge balance margin for the cell region. This causes the problem of degrading the breakdown voltage yield of the semiconductor device.

In addition, equipotential lines in the PN-columns are pulled by the P-rich region toward a rear surface side of the substrate. Conversely, in the N-rich region outside the P-rich region, the equipotential lines are pulled toward a front surface side of the substrate.

In particular, the front edges of the equipotential lines in the N-rich region extend toward the front surface side of the substrate. However, since the positions of the front edges are not fixed, the front edges of the individual equipotential lines in the N-rich region may possibly be concentrated on one location. This causes the possibility that the concentration of an electric field occurs to consequently reduce the breakdown voltage.

An object of the present disclosure is to provide a semiconductor device that can ensure a breakdown voltage without causing concentration of an electric field on a peripheral region. Another object of the present disclosure is to provide a semiconductor device that can restrict the peripheral region from narrowing a charge balance margin for a cell region and can improve a breakdown voltage yield.

Means for Solving the Problem

A semiconductor device according to a first aspect of the present disclosure includes a cell region and a peripheral region surrounding the cell region, and includes a semiconductor substrate, a semiconductor element, an element electrode of the semiconductor element, an outermost peripheral electrode, a second-conductivity-type layer, and a potential division region. The semiconductor substrate includes a first-conductivity-type layer, and first-conductivity-type column regions and second-conductivity-type column regions formed above the first-conductivity-type layer and serving as a drift region. The first-conductivity-type column regions and the second-conductivity-type column regions form a super-junction structure. A part of the semiconductor substrate is included in the cell region, while other part of the semiconductor substrate is included in the peripheral region. The semiconductor element and the element electrode are disposed in the cell region. The outermost peripheral electrode is electrically connected to the semiconductor substrate in the peripheral region. The second-conductivity-type layer is formed above the super-junction structure in the peripheral region. The potential division region is formed above the second-conductivity-type layer. The potential division region electrically connects the element electrode to the outermost peripheral electrode and also divides a voltage between the element electrode and the outermost peripheral electrode into a plurality of stages. A part of the potential division region overlaps the peripheral region when viewed from a thickness direction of the semiconductor substrate.

The semiconductor device according to the first aspect can ensure a breakdown voltage without causing concentration of an electric field on the peripheral region.

A semiconductor device according to a second aspect of the present disclosure includes a cell region where a semiconductor element is formed, and a peripheral region surrounding the cell region. The semiconductor device includes a semiconductor substrate having a first-conductivity-type layer, and first-conductivity-type column regions and second-conductivity-type column regions formed above the first-conductivity-type layer and serving as a drift region. The first-conductivity-type column regions and the second-conductivity-type column regions form a super-junction structure. A part of the semiconductor substrate is included in the cell region, while other part of the semiconductor substrate is included in the peripheral region. In the cell region, a first-conductivity-type charge amount and a second-conductivity-type charge amount are set equal. The semiconductor substrate further includes a charge balance change region in the peripheral region. In the charge balance change region, the first-conductivity-type charge amount in the super-junction structure is gradually increased to be larger than the second-conductivity-type charge amount toward an outer peripheral direction of the cell region.

The semiconductor device according to the second aspect can restrict the peripheral region from narrowing a charge balance margin for the cell region and can improve a breakdown voltage yield.

BRIEF DESCRIPTION OF DRAWINGS

The above and other objects, features and advantages of the present disclosure will become more apparent from the following detailed description made with reference to the accompanying drawings. In the drawings.

EMBODIMENTS FOR CARRYING OUT INVENTION

First Embodiment

Figure 1:
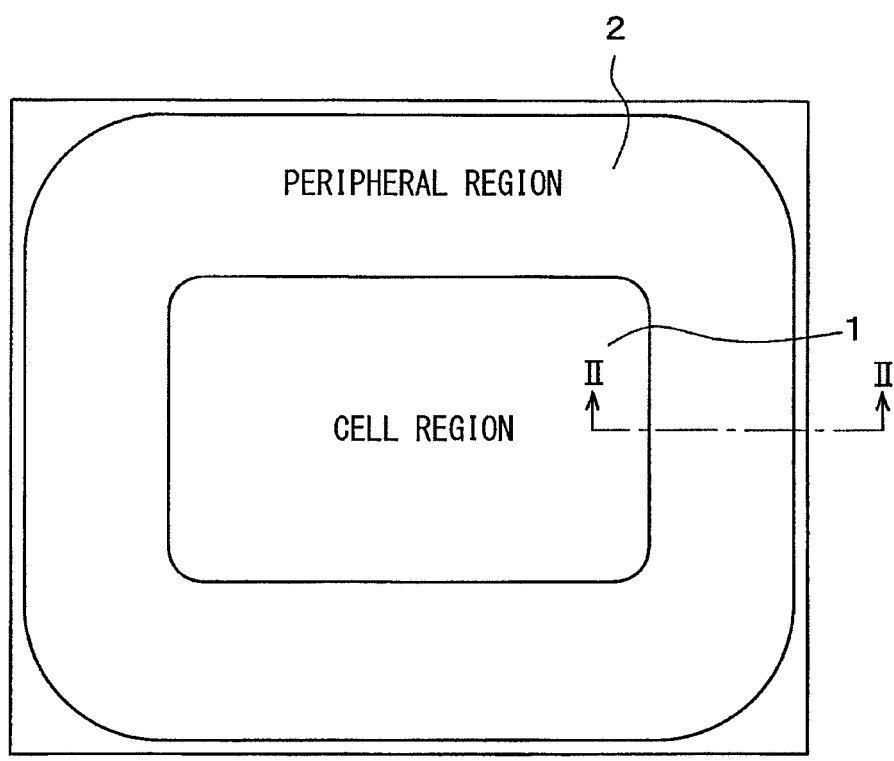
FIG. 1 is a plan view of a semiconductor device according to a first embodiment of the present disclosure.

A semiconductor device according to a first embodiment of the present disclosure will be described below with reference to the drawings. As shown in FIG. 1, the semiconductor device includes a cell region 1 where semiconductor elements are formed, and a peripheral region 2. On an outer periphery of the cell region 1 having a quadrilateral shape, the peripheral region 2 is provided so as to surround the cell region 1.

Figure 2:
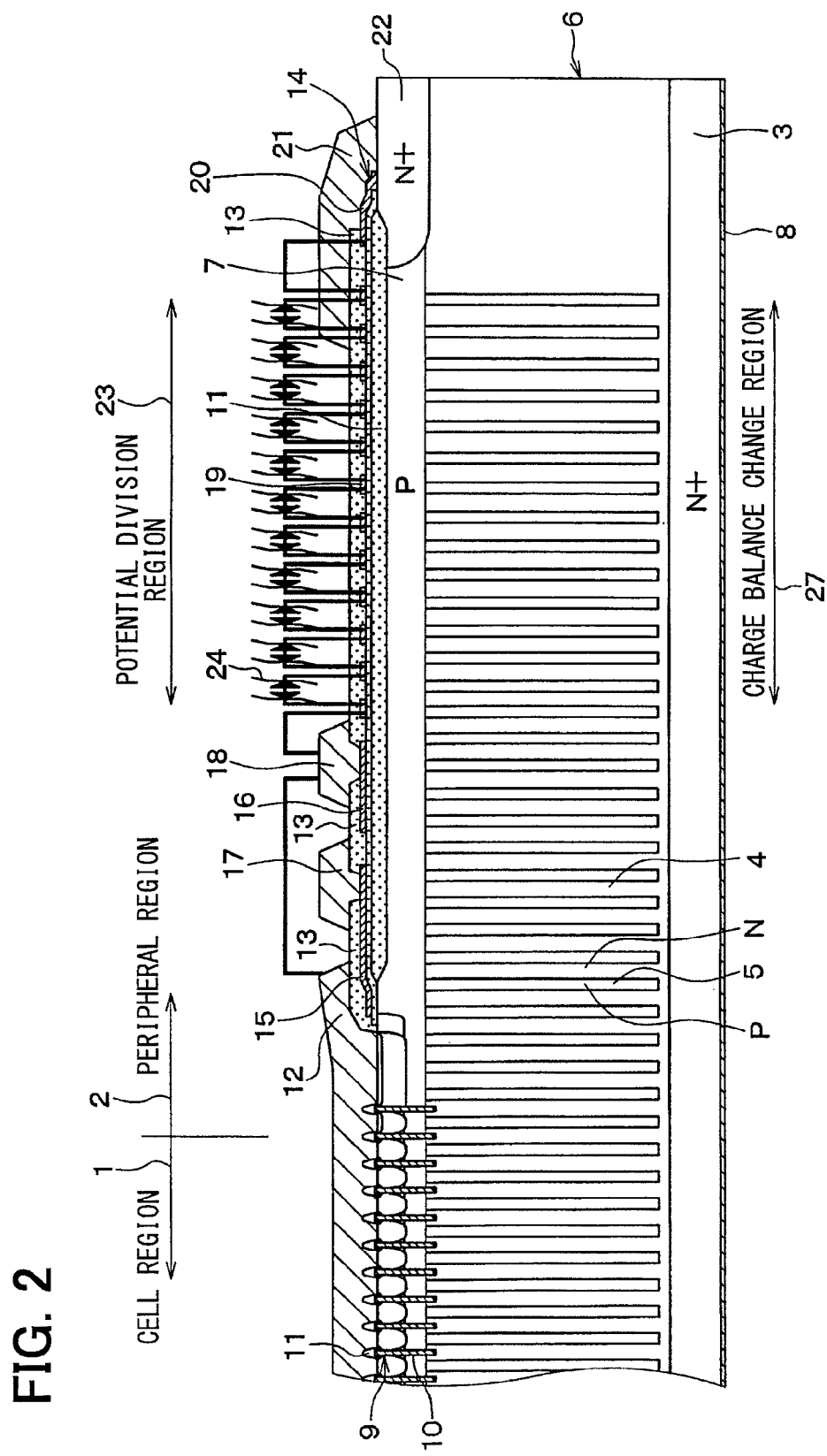
FIG. 2 is a cross-sectional view of the semiconductor device taken along the line I-I in FIG. 1.

As shown in FIG. 2, in the cell region 1, a large number of metal-oxide-film semiconductor field effect transistors (MOSFETs) are formed.

The semiconductor device includes a semiconductor substrate 6 formed with an SJ structure in which, above an N$^+$-type drain layer 3, N-type column regions 4 and P-type column regions 5 are formed as a drift region and repeatedly arranged in a direction parallel with the planar direction of the drain layer 3.

In addition, above the SJ structure, a P-type layer 7 formed by epitaxial growth is provided. The P-type layer 7 is provided over the cell region 1 and the peripheral region 2. On the other hand, on the side of the drain layer 3 opposite to the SJ structure, a drain electrode 8 is formed.

In the cell region 1, trench-gate MOSFETs are formed as semiconductor elements 9. Each of the MOSFETs has a typical structure, which will be briefly described below. A trench 10 is formed to extend through an N$^+$-type source region and a P-type channel layer each formed in the P-type layer 7 and reach the N-type column region 4. Over the inner wall surface of the trench 10, a gate insulating film and a gate layer are successively formed to form a trench-gate structure including the trench 10, the gate insulating film, and the gate layer. In the P-type channel layer, a P-type body region is also formed. Note that the structure of the MOSFET is illustrative, and another structure may also be used.

The trenches 10 are provided such that the planar directions of planes in which the N-type column regions 4 and the P-type column regions are in contact with each other are parallel with the extending directions in which the trenches 10 extend. If it is defined that one of the N-type column regions 4 and the one of the P-type column regions 5 that is adjacent to the N-type column region 4 pair up to form one column structure, it follows that the trench gate structure is provided for each one of the column structures.

In addition, on the gate layer, an interlayer insulating film 11 covering the gate layer and provided with contact holes exposing the P-type channel layers is formed. The interlayer insulating film 11 is made of, for example, local oxidation of silicon (LOCOS). A source electrode 12 is formed so as to cover the interlayer insulating film 11 and come in contact with the P-type channel layers via the contact holes.

On the other hand, in the peripheral region 2, the interlayer insulating film 11 is formed on the P-type layer 7. The thickness of the interlayer insulating film 11 is, for example, 800 nm. On the interlayer insulating film 11, an insulating layer 13 is formed and, on the insulating layer 13, a polysilicon layer 14 having a thickness of, for example, 400 nm is formed. The insulating layer 13 is made of, for example, boron phosphorous silicon glass (BPSG). The polysilicon layer 14 is patterned to serve as wiring and, from the cell region 1 side, a gate wire 15 and a field plate 16 are laid out in this order.

The gate wire 15 is electrically connected to the gate layer. On the gate wire 15, a gate electrode 17 is formed. On the field plate 16, a relay electrode 18 electrically connected to the source electrode 12 is formed.

Of the polysilicon layer 14, the portion located outside the field plate 16 is formed into a plurality of guard rings 19 which are laid out at equal intervals toward the side opposite to the cell region 1. The guard rings 19 are arranged as, for example, conductive regions in multiple rounds so as to surround the cell region 1. Note that, as the guard rings 19, for example, N-type conductive regions, P-type conductive regions, metal, or the like may also be used.

Of the polysilicon layer 14, the outermost portion is laid out as an outermost peripheral ring 20 and, on the outermost peripheral ring 20, an outermost peripheral electrode (EQR) 21 is formed. The outermost peripheral ring 20 is electrically connected to the one of the guard rings 19 that is closest to the outermost peripheral electrode 21.

The outermost peripheral electrode 21 is located closer to the outer edge portion of the semiconductor device, that is, on the outermost edge portion of the peripheral region 2. The outermost peripheral electrode 21 is electrically connected to an N-type epitaxial region located around the drift region via the N$^+$-type region 22 provided in the same layer as the P-type layer 7.

The gate wire 15, the field plate 16, the plurality of guard rings 19, and the outermost peripheral ring 20 are covered with the insulating layer 13, and a part of each of the gate wire 15, the field plate 16, and the outermost peripheral ring 20 is exposed from the insulating layer 13. The total thickness of the insulating layer 13 is, for example, 800 nm. The gate electrode 17 and the relay electrode 18 are connected to the gate wire 15 and the field plate 16 via the openings of the insulating layer 13.

The outermost peripheral electrode 21 is provided so as to overlap the SJ structure when viewed from the thickness direction (substrate normal direction) of the semiconductor substrate 6. As a result, the expansion of a potential distribution in the SJ structure is suppressed by the outermost peripheral electrode 21.

Of the region of the peripheral region 2 in which the polysilicon layer 14 is laid out, the region where the plurality of guard rings 19 are laid out is used as a potential division region 23. That is, the potential division region 23 is a region located over the P-type layer 7 (on the insulating layer 13 side) to electrically connect the source electrode 12 (relay electrode 18) to the outermost peripheral electrode 21 and also divide the voltage between the source electrode 12 (relay electrode 18) and the outermost peripheral electrode 21 into a plurality of stages. Note that the length of the peripheral region 2 is, for example, 250 µm, and the length of the potential division region 23 is, for example, 100 µm.

To divide the voltage into the plurality of stages, the individual guard rings 19 are connected by zener diodes 24 ensuring desired breakdown voltages. In the present embodiment, the zener diodes 24 are provided such that element potentials are distributed in the outer diametrical direction of the semiconductor device. The breakdown voltage of the zener diode 24 in one stage which connects one of the guard rings 19 to the guard ring 19 adjacent thereto is, for example, 30 V. Using such a zener diode 24, a voltage of, for example, 600 V is divided.

The plurality of guard rings 19 are arranged at equal intervals in the potential division region 23 from the source electrode 12 (relay electrode 18) side toward the outermost peripheral electrode 21. Accordingly, the potential division region 23 divides the voltage at equal intervals between the source electrode 12 (relay electrode 18) and the outermost peripheral electrode 21 into the plurality of stages from the source electrode 12 (relay electrode 18) side toward the outermost peripheral electrode 21 side. As a result, it is possible to fix potentials at equal intervals in the potential division region 23 from the source electrode 12 (relay electrode 18) side toward the outermost peripheral electrode 21 side. Thus, a wide margin (charge balance margin) can be ensured for variations in impurity concentration against the deterioration of the breakdown voltages.

Note that the layout in which the guard rings 19 are arranged at equal intervals is illustrative. As long as a potential distribution formed in the semiconductor substrate 6 in the potential division region 23 can be fixed at equal intervals, the guard rings 19 need not be arranged at equal intervals.

Figure 3:
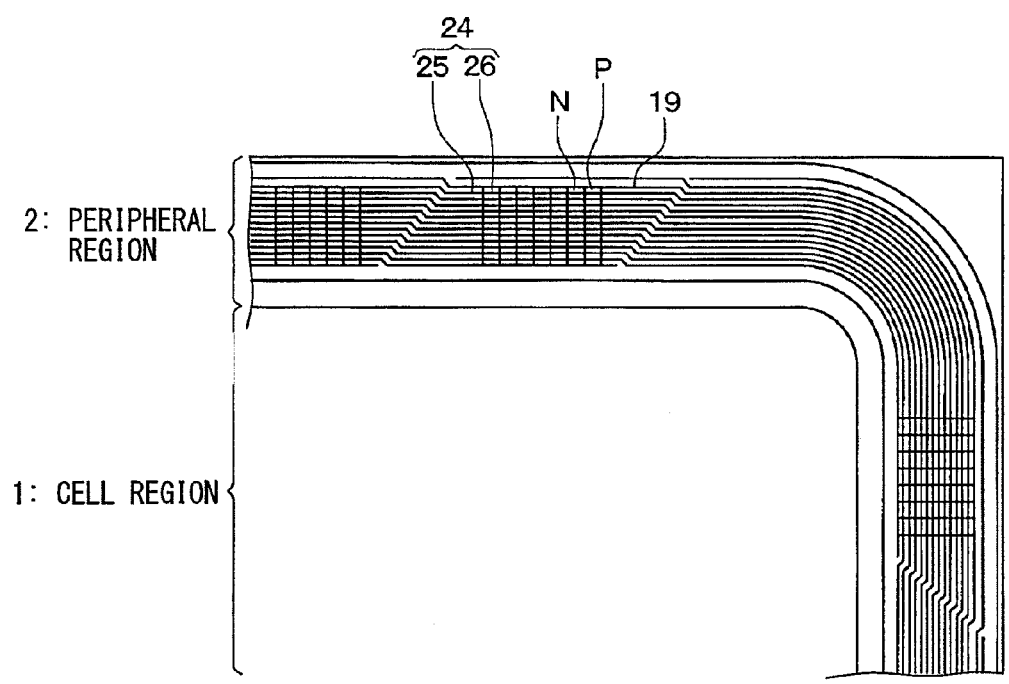
FIG. 3 is a plan view showing guard rings and zener diodes in a peripheral region.

As shown in FIG. 3, each of the zener diodes 24 includes N-type regions 25 and P-type regions 26 which are alternately arranged along the extending direction of the guard rings 19 between one of the guard rings 19 and the other guard ring 19. The N-type regions 25 and the P-type regions 26 are formed by ion implantation into polysilicon. Since the zener diodes 24 are arranged in series, the potential of the guard ring 19 in each stage is divided.

Subsequently, a charge balance in the SJ structure of the semiconductor substrate 6 will be described. In the present embodiment, the N-type column regions 4 and the P-type column regions 5, which form the SJ structure, are repeatedly arranged all over the cell region 1 and the peripheral region 2. The depths of the N-type column regions 4 and the P-type column region 5 are, for example, 47 µm and the pitch is 7 µm.

In the cell region 1, the impurity concentration of each of the N-type column regions 4 is the same as the impurity concentration of each of the P-type column regions 5. The number of P-carriers is the same as the number of N-carriers in the PN-columns. That is, the charge balance condition is the same in each of the PN-columns. For example, each of the impurity concentrations in the N-type column regions 4 and the P-type column regions 5 is $5 \times 10^{15}$ cm$^{-3}$.

On the other hand, the peripheral region 2 is provided with a region where the balance between the respective impurity concentrations in the N-type column regions 4 and the P-type column regions 5 continuously changes toward the side opposite to the cell region 1. This region is a region under the P-type layer 7 (on the drain layer 3 side) and referred to as the charge balance change region 27. Note that the outermost peripheral electrode 21 is located around the charge balance change region 27.

Figure 4A:
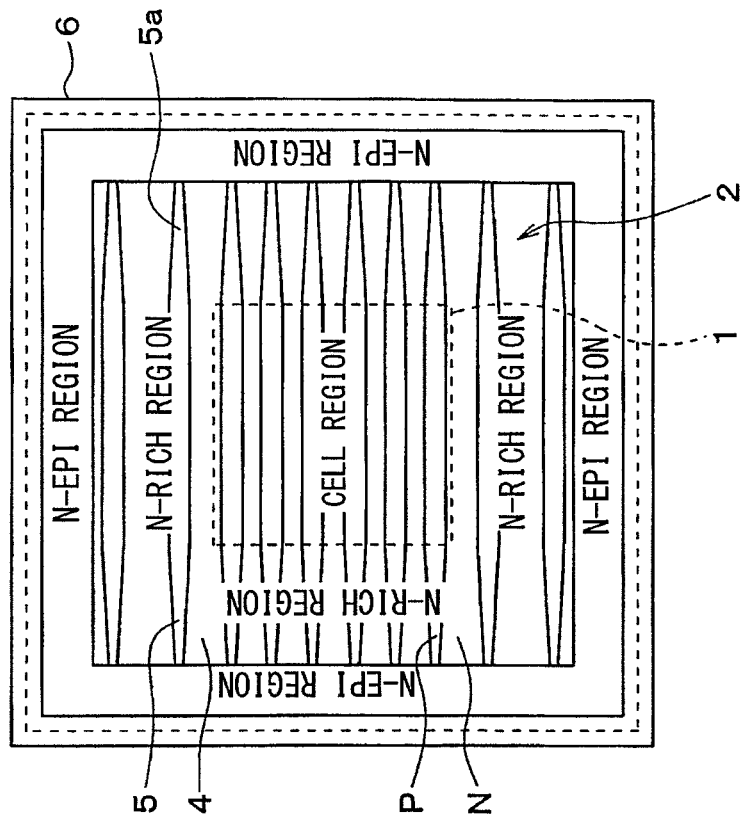
FIG. 4(a) is a plan view in which the widths of P-type column regions in the peripheral region are changed at an equal rate.
Figure 4B:
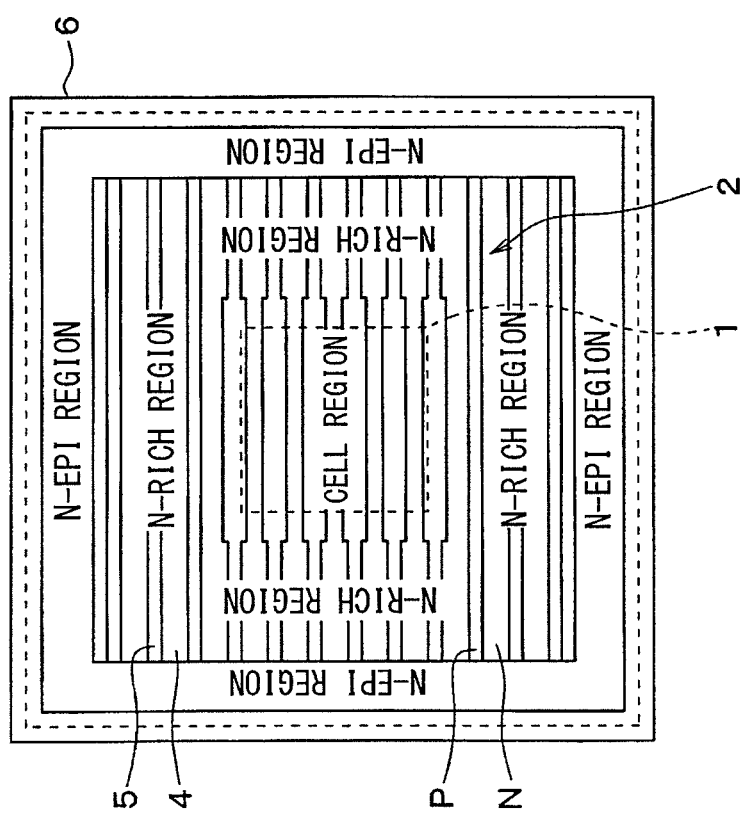
FIG. 4(b) is a plan view in which the widths of P-type column regions in the peripheral region are continuously changed.

Here, in the charge balance change region 27 of the peripheral region 2, the balance between the impurity concentrations continuously changes toward the side opposite to the cell region 1. A description will be given with reference to FIGS. 4(a) and 4(b). Examples of a planar layout of the SJ structure located in the peripheral region 2 are shown in FIGS. 4(a) and 4(b). Note that, in FIG. 4, the peripheral region 2 is expressed as the "N-Rich Region" and the N-type epitaxial region around the drift region is expressed as the "N-Epi region".

When the direction in which the N-type column regions 4 and the P-type column regions 5 are repeatedly arranged is referred to as a repetition direction, in FIG. 4(a), the widths of the P-type column regions 5 located in the peripheral region 2 in the repetition direction are reduced at an equal rate to be smaller than the widths of the P-type column regions 5 located in the cell region 1. However, since the widths of the P-type column region 5 in the peripheral region 2 are constant in the peripheral region 2, the balance between the impurity concentrations in the charge balance change region 27 of the peripheral region 2 does not change and is constant.

On the other hand, in FIG. 4(b), in the peripheral region 2, the widths of the P-type column regions 5 in the directions perpendicular to the repetition direction in the planar direction of the drain layer 3 continuously decrease toward end portions 5a of the P-type column regions 5. That is, the end portions 5a of the P-type column directions 5 taper in the perpendicular directions. In other words, the widths of the N-type column regions 4 in the perpendicular directions continuously increase. As a result, in the peripheral region 2, the volume of each of the N-type column regions 4 continuously increases with increasing distance from the cell region 1 so that the balance between the impurity concentrations shifts toward the N-type in the repetition direction. That is, the N-type predominates and an N-rich state prevails toward the outermost edge portion of the peripheral region 2. With such a planar layout of the P-type column regions 5, the balance between the impurity concentrations in the charge balance change region 27 continuously changes.

In the present embodiment, the potential division region 23 is disposed so as to overlap the charge balance change region 27 when viewed from the thickness direction of the semiconductor substrate 6.

Figure 5:
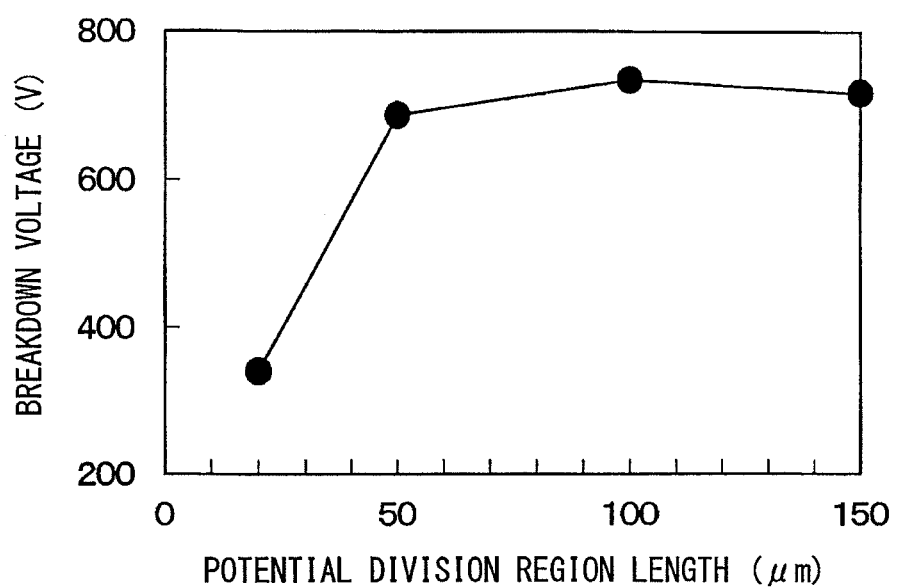
FIG. 5 is a diagram showing the relationship between the length of a potential division region and a breakdown voltage.

The present inventors have examined the relationship between the length of the potential division region 23 and the breakdown voltage. The result thereof is shown in FIG. 5. The "length of the potential division region 23" corresponds to the distance from the end portion of the potential division region 23 located on the cell region 1 side in the planar direction of the drain layer 3 to the end portion thereof located on the outermost peripheral electrode 21 side.

When FIG. 5 is viewed, the breakdown voltage is stable when the length of the potential division region 23 is not less than 50 µm. Here, the length of 50 µm has a value larger than a depth from the surface of the P-type layer 7 to the drain layer 3.

That is, when the length of the potential division region 23 is short, the breakdown voltage is determined by the peripheral region 2. However, when the length of the potential division region 23 is larger than the depth from the surface of the P-type layer 7 to the drain layer 3, a stable breakdown voltage of not less than 600 V can be obtained, and the breakdown voltage in the peripheral region 2 can be ensured with certainty. Accordingly, the length of the potential division region 23 described above is larger than the depth from the surface of the P-type layer 7 to the drain layer 3.

Subsequently, the present inventors have examined the breakdown voltages of the semiconductor device in the presence/absence of the potential division region 23 in the peripheral region 2 and in the presence/absence of the charge balance change region 27 in the peripheral region 2. The results thereof are shown in FIG. 6(a) through FIG. 8(b).

Figure 6A:
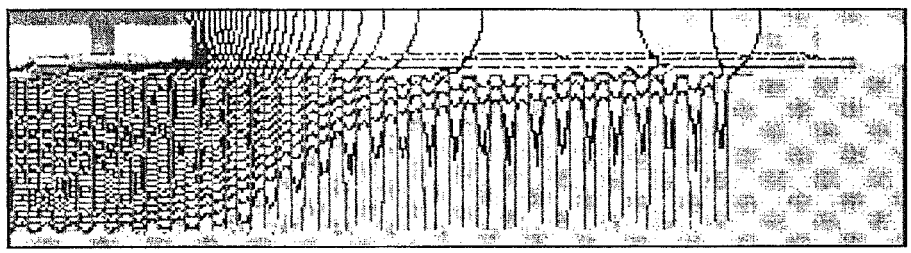
FIG. 6(a) is a diagram showing the result of simulation of a potential distribution when, in a structure in which the peripheral region is not provided with the potential division region, the concentration of an N-type impurity in the peripheral region is held constant.
Figure 6B:
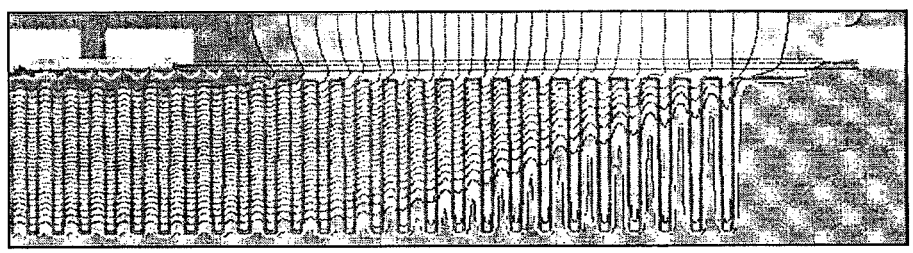
FIG. 6(b) is a diagram showing the result of simulation of a potential distribution in a structure in which, in the structure in which the peripheral region is not provided with the potential division region, the concentration of the N-type impurity in the peripheral region is continuously changed.

First, FIG. 6(a) and FIG. 6(b) show the result of simulation of a potential distribution in a structure in which the potential division region 23 (guard rings 19 and zener diodes 24) is not provided in the peripheral region 2 and the impurity concentration of each of the N-type column regions 4 is set, for example, 10% higher than the impurity concentration of each of the P-type column regions 5 in the peripheral region 2.

FIG. 6(a) shows the result of simulation in a structure in which the SJ structure of the peripheral region 2 has the layout shown in FIG. 4(a). That is, the potential distribution in a structure in which the excess concentration calculated by excess concentration={(the impurity amount in the N-type column region 4)−(the impurity amount in the P-type column region 5)}/(the volume of the column portion) is uniform in the peripheral region 2 is shown. From the result, it can be seen that the equipotential lines are concentrated on the cell region 1 side in the peripheral region 2 and the concentration of an electric field may possibly occur.

By contrast, FIG. 6(b) shows the result of simulation in a structure in which the SJ structure of the peripheral region 2 has the layout shown in FIG. 4(b). That is, FIG. 6(b) shows the result of simulation in the structure in which the balance between the impurity concentrations continuously changes in the charge balance change region 27 of the peripheral region 2. From the result, it can be seen that the equipotential lines change by small degrees from the cell region 1 side of the peripheral region 2.

The results of simulation of a potential distribution in a structure obtained by providing the guard rings 19 in the structure having a potential distribution as described above are shown in FIG. 7(a) and FIG. 7(b). Since the guard rings 19 are provided, a potential on the guard ring 19 side in the SJ structure is fixed.

Figure 7A:
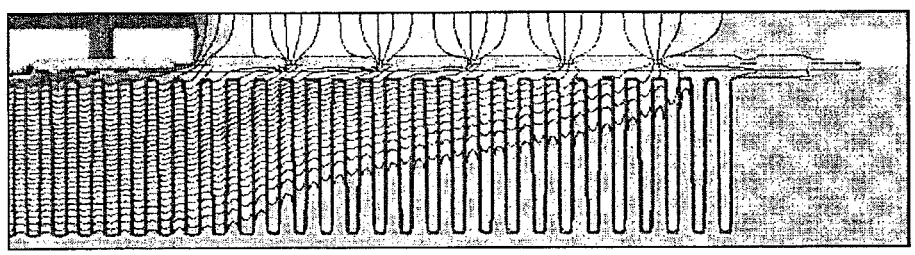
FIG. 7(a) is a diagram showing the result of simulation of a potential distribution when, in a structure in which the peripheral region is provided with the potential division region, the concentration of the N-type impurity in the peripheral region is held constant.

FIG. 7(a) shows the result of simulation in a structure obtained by providing the guard rings 19 in the structure of FIG. 6(a). According to the result, the equipotential lines in the peripheral region 2 are not smoothly drawn, and the intervals between the equipotential lines are non-uniform.

Figure 7B:
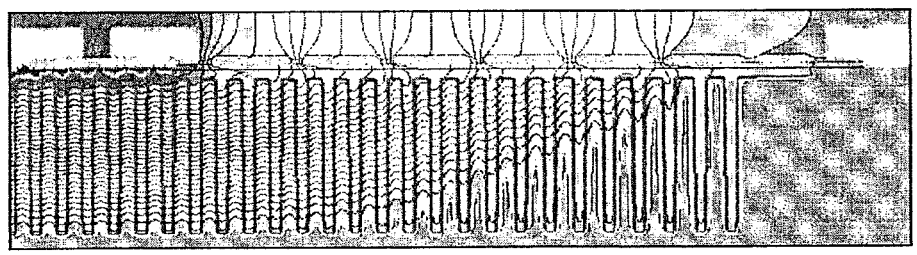
FIG. 7(b) is a diagram showing the result of simulation of a potential distribution in the structure in which, in the structure in which the peripheral region is provided with the potential division region, the concentration of the N-type impurity in the peripheral region is continuously changed.

On the other hand, FIG. 7(b) shows the result of simulation in a structure obtained by providing the guard rings 19, which has potentials fixed at equal intervals, in the structure of FIG. 6(b). According to the result, the equipotential lines in the SJ structure are smoothly drawn, and the intervals between the equipotential lines are uniform.

Figure 8A:
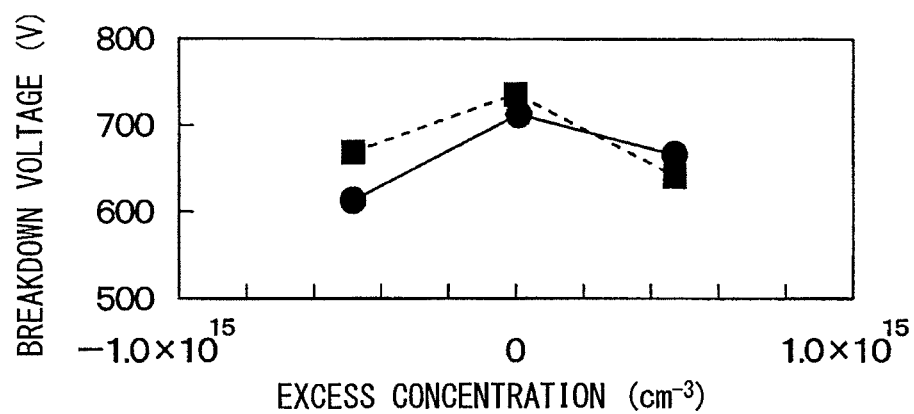
FIG. 8(a) is a diagram showing the relationship between an excess concentration in the peripheral region and the breakdown voltage of the semiconductor device in a structure not provided with a charge balance change region.
Figure 8B:
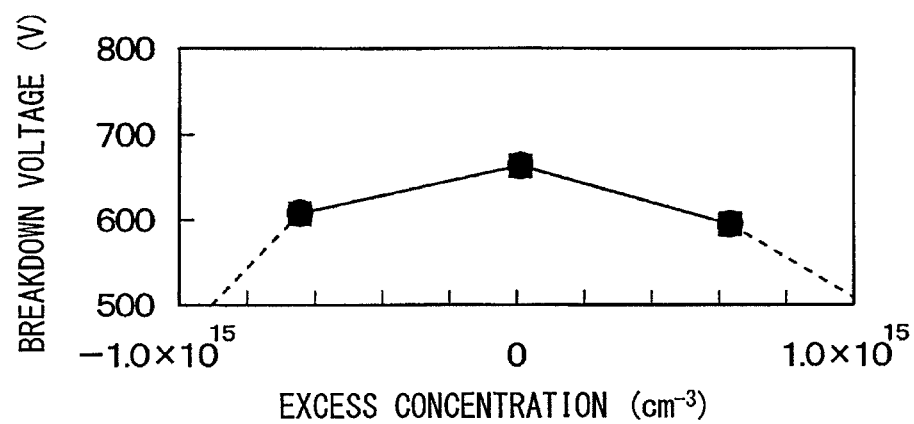
FIG. 8(b) is a diagram showing the relationship between the excess concentration in the peripheral region and the breakdown voltage of the semiconductor device in the structure provided with the charge balance change region.

FIG. 8(a) and FIG. 8(b) are diagrams each showing the relationship between the excess concentration in the peripheral region 2 and the breakdown voltage of the semiconductor device. In each of FIG. 8(a) and FIG. 8(b), the breakdown voltage of a structure not provided with the guard rings 19 is shown by the broken line, and the breakdown voltage of a structure provided with the guard rings 19 is shown by the solid line.

FIG. 8(a) shows the breakdown voltages in the presence/absence of the guard rings 19 in the structure not provided with the charge balance change region 27. According to the result, it is understood that a difference is produced in breakdown voltage depending on the presence/absence of the guard rings 19 irrelevantly to a change in the excess concentration in the peripheral region 2. This is because, since a potential distribution in a silicon surface formed by the SJ structure in the peripheral region 2 does not match a surface potential distribution defined by the guard rings 19, the potential distribution formed by the SJ structure in the peripheral region 2 is affected. In the case of FIG. 8(a), the breakdown voltage has deteriorated in the vicinity of the outermost peripheral ring 20 in the peripheral region 2.

In contrast, FIG. 8(b) shows the breakdown voltages in the presence/absence of the guard rings 19 in the structure provided with the charge balance change region 27. According to the result, even when the excess concentration in the peripheral region 2 changes, no difference is produced in breakdown voltage depending on the presence/absence of the guard rings 19. By matching the potential distribution in the silicon surface formed by the SJ structure of the peripheral region 2 and the surface potential distribution defined by the guard rings 19, it is possible to ensure a wide margin (charge balance margin) for variations in impurity concentration against the deterioration of the breakdown voltage. In the present embodiment, by providing the structure in which the balance between the impurity concentrations in the peripheral region 2 continuously changes and also arranging the guard rings 19 at equal intervals as described above, the surface potential distributions in the SJ structure in the peripheral regions 2 are equal intervals.

Next, a method of manufacturing the semiconductor device including the charge balance change region 27 in the semiconductor substrate 6 and including the potential division region 23 on the interlayer insulating film 11 will be described. First, the semiconductor substrate 6 including the SJ structure is prepared. Here, in the prepared semiconductor substrate 6, the SJ structure corresponding to the peripheral region 2 has the planar layout of FIG. 4(b) to cause the balance between the impurity concentrations in the charge balance change region 27 in the peripheral region 2 continuously change.

Then, the semiconductor elements in the cell region 1 are formed by a typical semiconductor process. Additionally, in the semiconductor substrate 6, the P-type layer 7 is formed on the outer periphery of the cell region 1, and the interlayer insulating film 11 is formed above the P-type layer 7.

Thereafter, above the interlayer insulating film 11, the insulating layer 13 and the polysilicon layer 14 are formed, and the polysilicon layer 14 is laid out into the gate wire 15, the field plate 16, the plurality of guard rings 19, and the outermost peripheral ring 20. The polysilicon layer 14 is also left so as to provide coupling between the individual guard rings 19. Here, the individual guard rings 19 are laid out such that the plurality of guard rings 19 located in the potential division region 23 are located above the charge balance change region 27.

Then, ion implantation is performed into the polysilicon layer 14 located between the individual guard rings 19 to alternately form the N-type regions 25 and the P-type regions 26 along the extending direction of the guard rings 19. Subsequently, the insulating layer 13 is further formed so as to cover each of the guard rings 19, the N-type regions 25, and the P-type regions 26 and parts of the insulating layer 13 are opened. The source electrode 12, the gate electrode 17, the relay electrode 18, and the outermost peripheral electrode 21 are simultaneously formed all over the cell region 1 and the peripheral region 2. Thus, the semiconductor device shown in FIG. 1 through FIG. 3 is completed.

As described heretofore, the present embodiment is characterized in that the peripheral region 2 is provided with the charge balance change region 27 where the balance between the impurity concentrations continuously changes, and the potential division region 23 which divides the voltage between the source electrode 12 and the drain electrode 18 into a plurality of parts is provided above the charge balance change region 27.

Since the potential division region 23 is located above the charge balance change region 27 where the impurity concentrations continuously change, it is possible to achieve a shielding effect against the influence of charges trapped between the interlayer insulating film 11 and the insulating layer 13 in the peripheral region 2 and consequently prevent fluctuations in breakdown voltage. Therefore, it is possible to ensure the breakdown voltage without causing concentration of an electric field on the peripheral region 2.

Note that the N-type column regions 4 are an example of first-conductivity-type column regions and the P-type column regions 5 are an example of second-conductivity-type column regions. Also, the source electrode 12 is an example of an element electrode.

Second Embodiment

Figure 9:
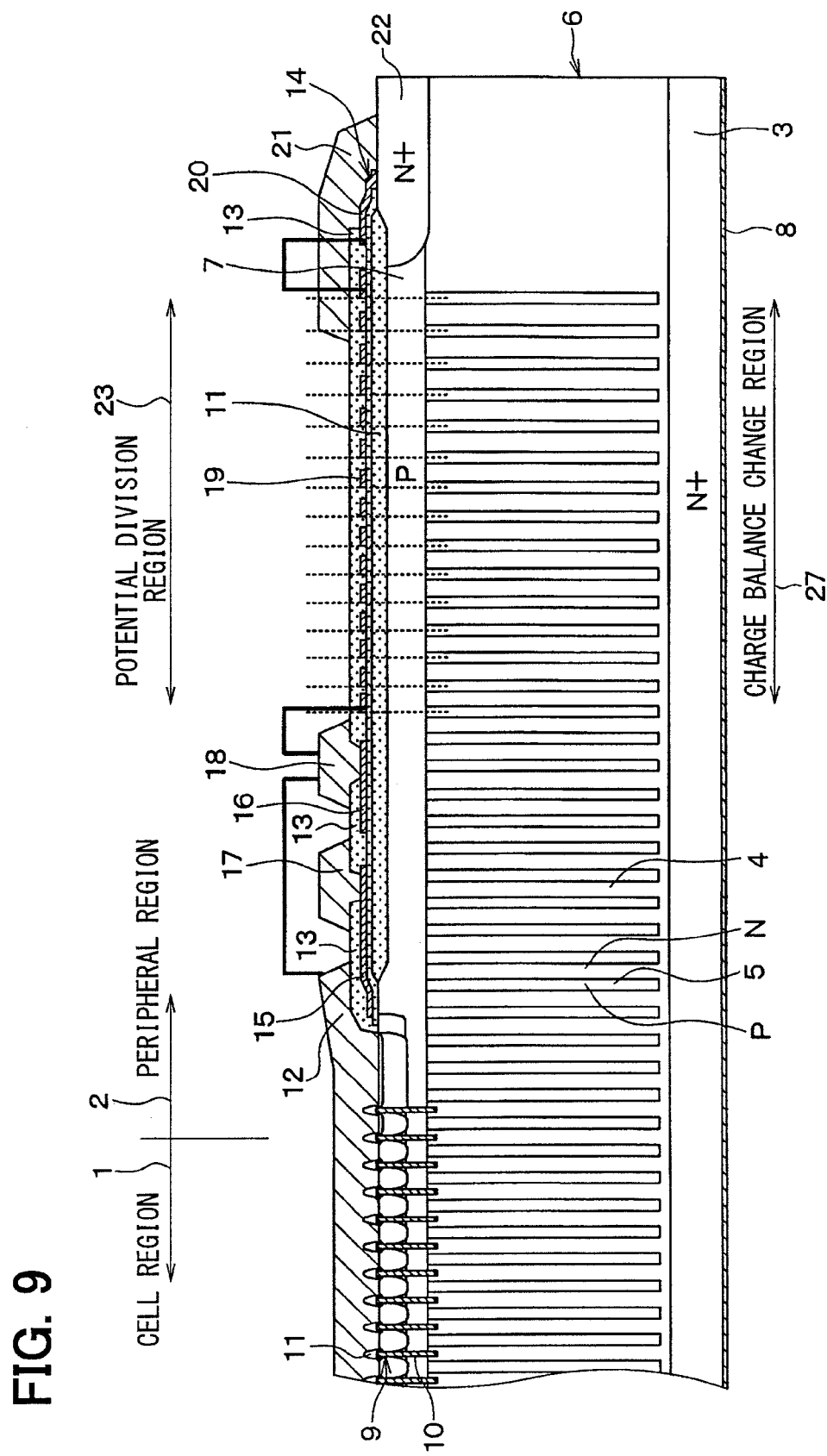
FIG. 9 is a cross-sectional view of a semiconductor device according to a second embodiment of the present disclosure.

A semiconductor device according to a second embodiment of the present disclosure will be described with reference to FIG. 9. In FIG. 9, the wires between the electrodes and the zener diodes 24 are omitted.

As shown in FIG. 9, in the present embodiment, the individual guard rings 19 extending in directions perpendicular to the direction in which the N-type column regions 4 and the P-type column regions 5 are repeatedly provided in the planar direction of the drain layer 3 overlap the respective P-type column region 5 when viewed from the thickness direction of the semiconductor substrate 6. Thus, the end portions of the guard rings 19 may also be located above the P-type column regions 5.

Third Embodiment

Figure 10A:
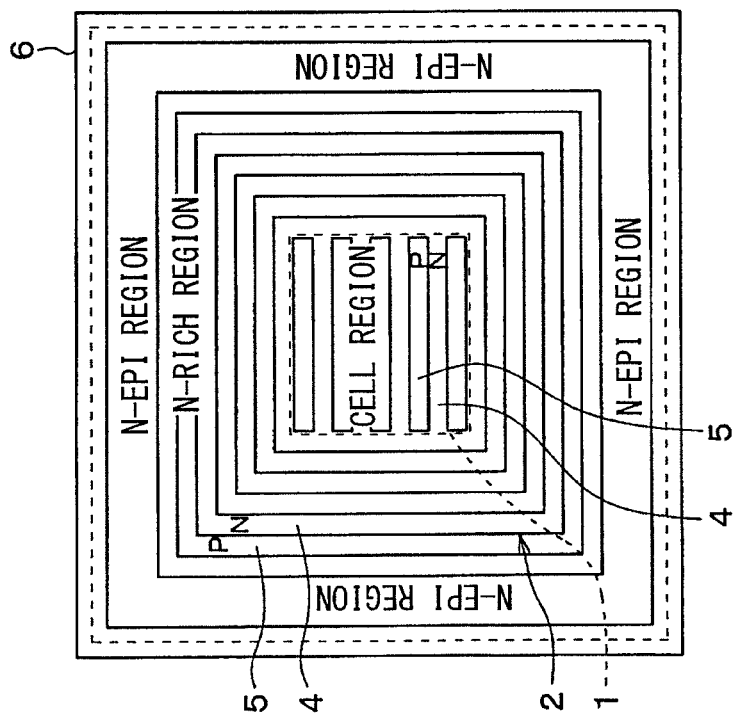
FIG. 10(a) is a plan view showing an example of the layout of an SJ structure in a semiconductor device according to a third embodiment of the present disclosure.
Figure 10B:
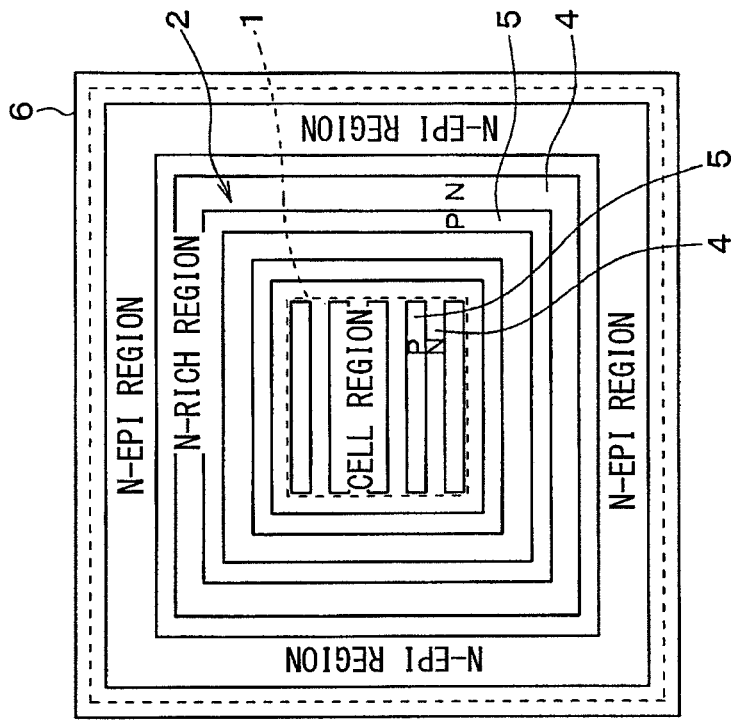
FIG. 10(b) is a plan view showing another example of the layout of the SJ structure in the semiconductor device according to the third embodiment.

A semiconductor device according to a third embodiment of the present disclosure will be described with reference to FIG. 10(a) and FIG. 10(b). As shown in FIG. 10(a) and FIG. 10(b), in the peripheral region 2, the N-type column regions 4 and the P-type column regions 5, which form the SJ structure, are laid out in a ring shape (multi-round frame shape) surrounding the cell region 1. Toward the side opposite to the cell region 1, the N-type column regions 4 and the P-type column regions 5 are repeatedly arranged.

Here, in FIG. 10(a), in the repetition direction in which the N-type column regions 4 and the P-type column regions 5 are repeatedly arranged, the respective widths of the N-type column regions 4 and the P-type column regions 5 are constant and the N-type column regions 4 are arranged at equal intervals. In the placement, there is no change in the balance between the impurity concentrations in the charge balance change region 27 of the peripheral region 2.

On the other hand, in FIG. 10(b), the widths of the N-type column regions 4 in the charge balance change region 27 increase with increasing distance from the cell region 1. In other words, with increasing distance from the cell region 1, the intervals of the P-type column regions 5 increase. As a result, carriers increase in the N-type column regions 4 so that the charge balance change region 27 is in an N-rich state. In this manner, it is possible to continuously change the balance between the impurity concentrations in the charge balance change region 27.

Fourth Embodiment

A semiconductor device according to a fourth embodiment of the present disclosure will be described. In each of the embodiments described above, the individual guard rings 19 are connected to each other with the zener diodes 24 which are the potential division elements. However, in the present embodiment, the individual guard rings 19 are connected with resistors.

Figure 11A:
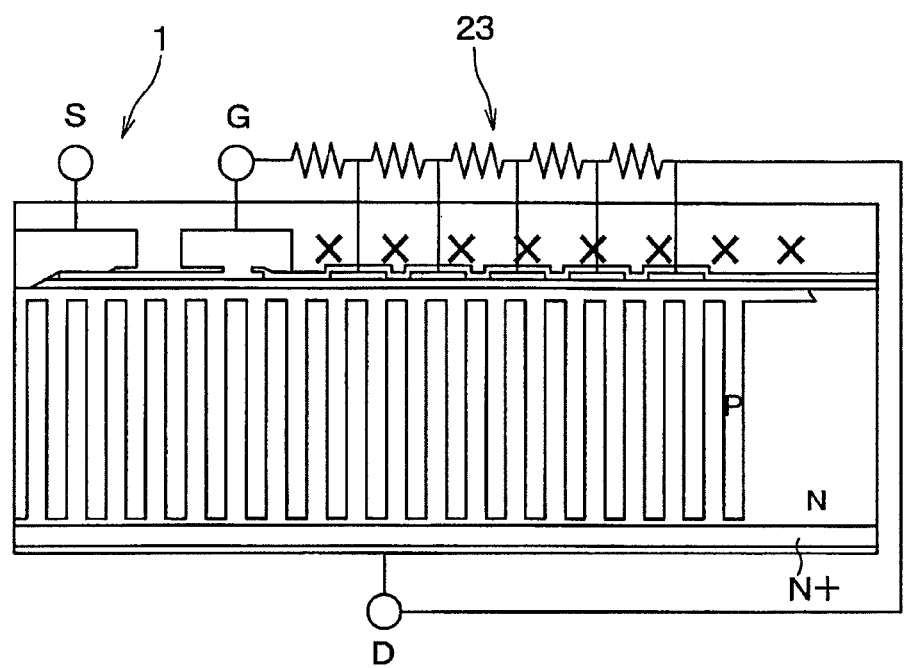
FIG. 11(a) is a cross-sectional view of a peripheral region in a semiconductor device according to a fourth embodiment of the present disclosure.

FIG. 11(a) is a cross-sectional view in the peripheral region 2 of the semiconductor device according to the present embodiment. As shown in the drawing, in the present embodiment, the gate electrode 17 and the drain electrode 8 are subjected to potential division using the potential division region 23. As potential division elements, resistors 28 are used. The resistance value of each of the resistors 28 is, for example, $1 \times 10^{10} \Omega$.

Figure 11B:
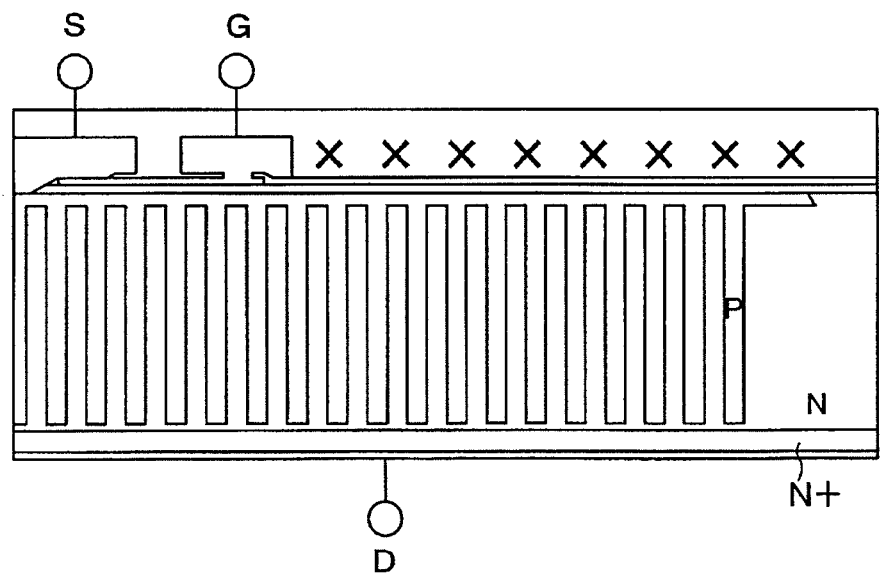
FIG. 11(b) is a cross-sectional view of the peripheral region in a semiconductor device not provided with guard rings.
Figure 12:
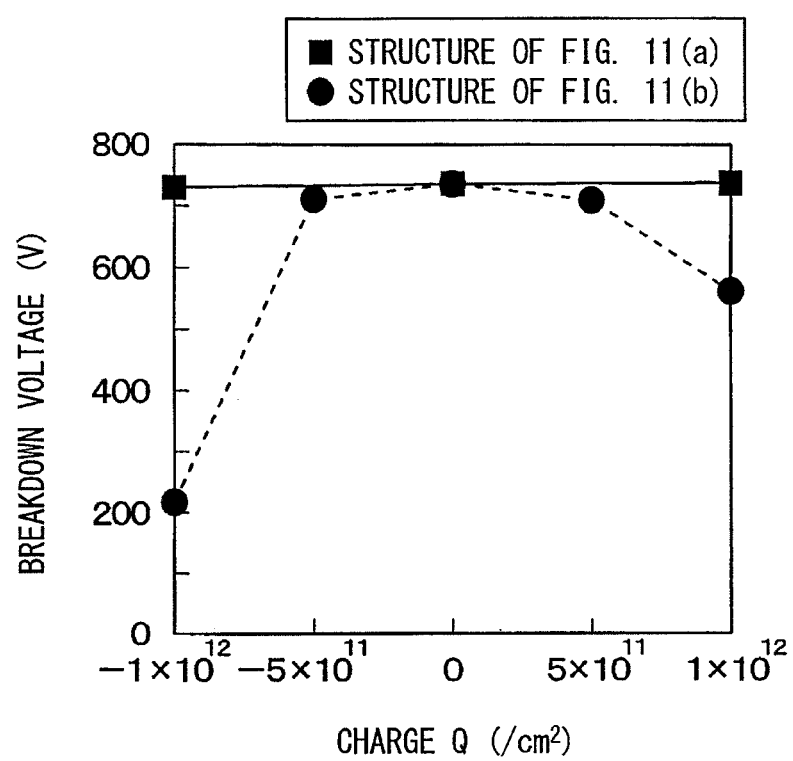
FIG. 12 is a diagram showing the relationship between charges Q trapped between an interlayer insulating film and an insulating layer and a breakdown voltage in each of the structures shown in FIG. 11(a) and FIG. 11(b)

The present inventors have examined the breakdown voltages in the presence/absence of the potential division region 23 in the structure of the peripheral region 2 shown in FIG. 11(a). The result thereof is shown in FIG. 12. FIG. 12 shows the relationship between charges Q trapped between the interlayer insulating film 11 and the insulating layer 13 and the breakdown voltage. As shown in FIG. 12, in the structure not provided with the potential division region 23 shown in FIG. 11(b), the breakdown voltage unstably changes in response to the presence of the charges Q. It has been found that, on the other hand, in a structure provided with the potential division region 23 as shown in FIG. 11(a), a constant breakdown voltage can be obtained without depending on the presence of the charges Q.

Note that, also in the structure using the zener diodes 24 as the potential division elements, the same effect as obtained in FIG. 12 has been obtained.

Thus, as the potential division elements, the resistors 28 may also be used. By reducing the impurity concentrations when the zener diodes 24 shown in the first embodiment are formed, the N-type regions 25 and the P-type impurity regions 26 which form the zener diodes 24 can be used as the resistors 28.

Since the voltage between the gate electrode 17 and the drain electrode 8 is divided, the relay electrode 18 for connecting the guard rings 19 to the source electrode 12 is no longer needed. Accordingly, the semiconductor device can be downsized.

Note that the gate electrode 17 is an example of the element electrode.

Fifth Embodiment

Figure 13:
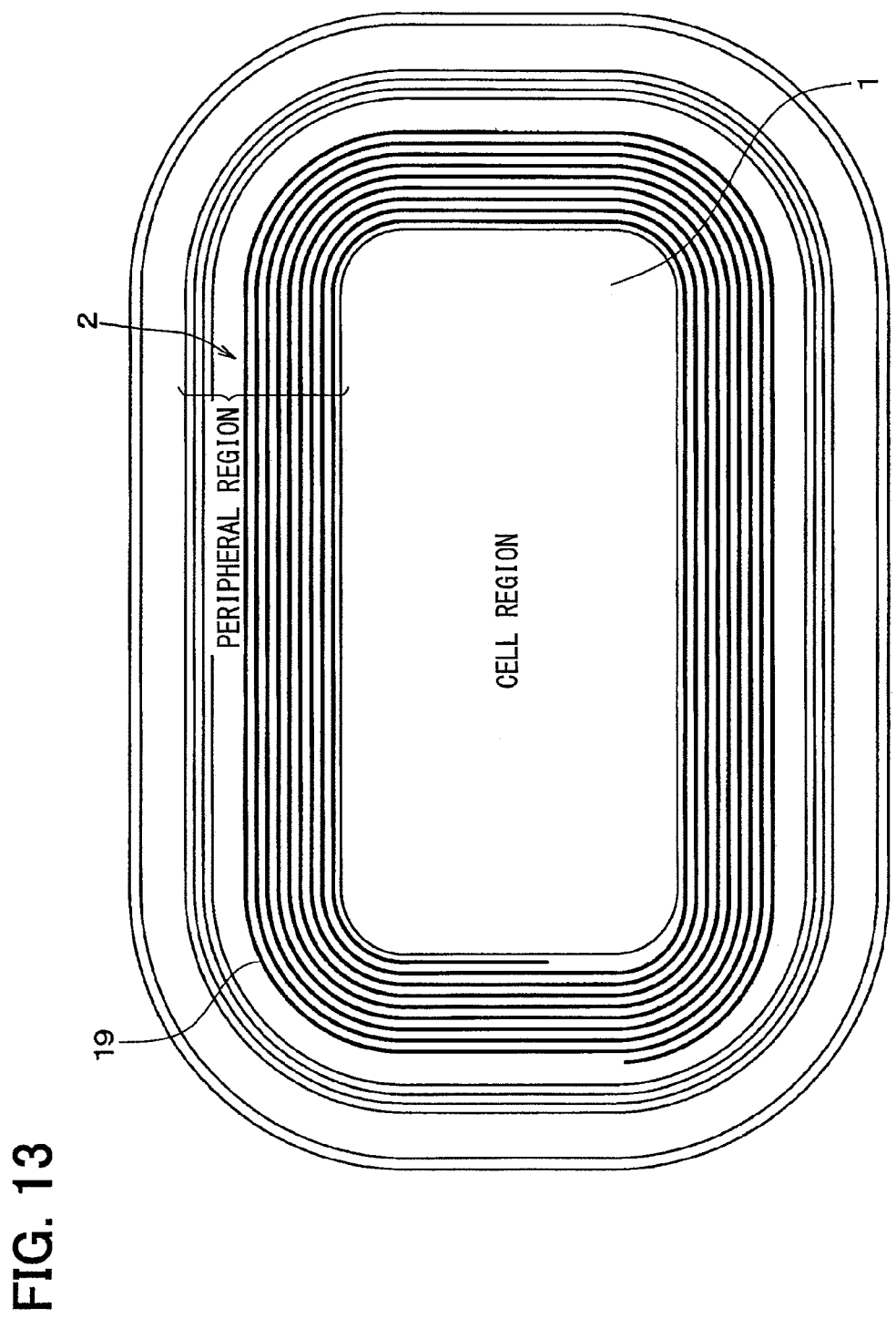
FIG. 13 is a plan view of a semiconductor device according to a fifth embodiment of the present disclosure.

A semiconductor device according to a fifth embodiment of the present disclosure will be described with reference to FIG. 13. As shown in FIG. 13, in the present embodiment, the one guard ring 19 is disposed in a spiral shape. Accordingly, potentials of the respective stages can be divided using the resistive component of the guard ring 19.

Sixth Embodiment

A semiconductor device according to a sixth embodiment of the present disclosure will be described with reference to FIG. 14.

Figure 14:
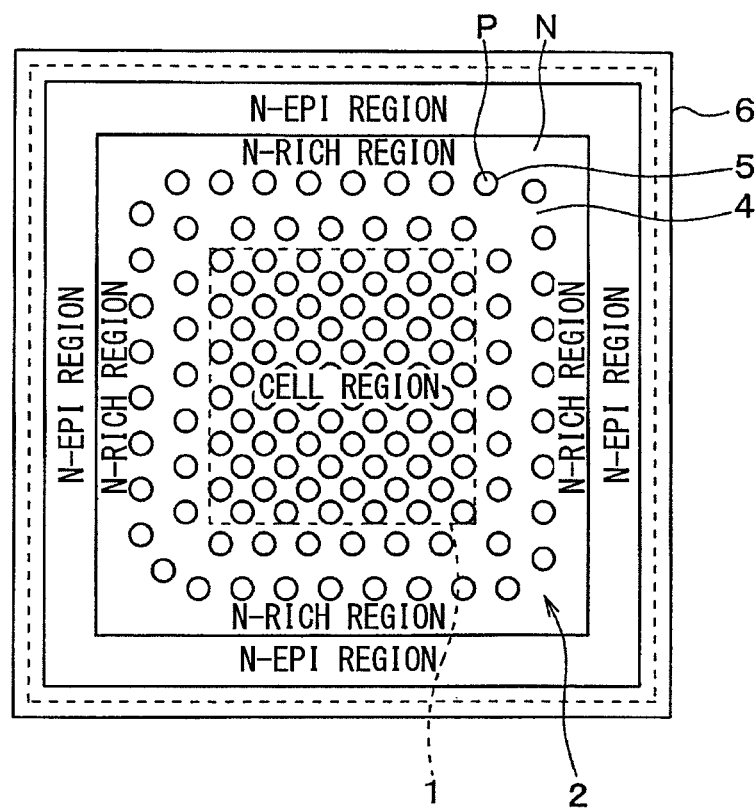
FIG. 14 is a plan view of a semiconductor device according to a sixth embodiment of the present disclosure.

As shown in FIG. 14, in the present embodiment, a layout has a pattern in which the P-type column regions 5 are scattered in a dotted-shape in the N-type column region 4. That is, the N-type column region 4 and the P-type column region 5 are alternately and repeatedly arranged in a radial direction from the center of the cell region 1. The ratio of the P-type column regions 5 formed in the peripheral region 2 is set lower than the ratio of the P-type column regions 5 formed in the cell region 1 and is reduced toward the outer peripheral direction of the cell region 1.

Even when the P-type column regions 5 are formed in the dotted-shape in the N-type column region 4, the charge balance change region 27 can be configured and the same effect as obtained in the first embodiment can be obtained.

Seventh Embodiment

A semiconductor device according to a seventh embodiment of the present disclosure will be described with reference to FIG. 15.

Figure 15:
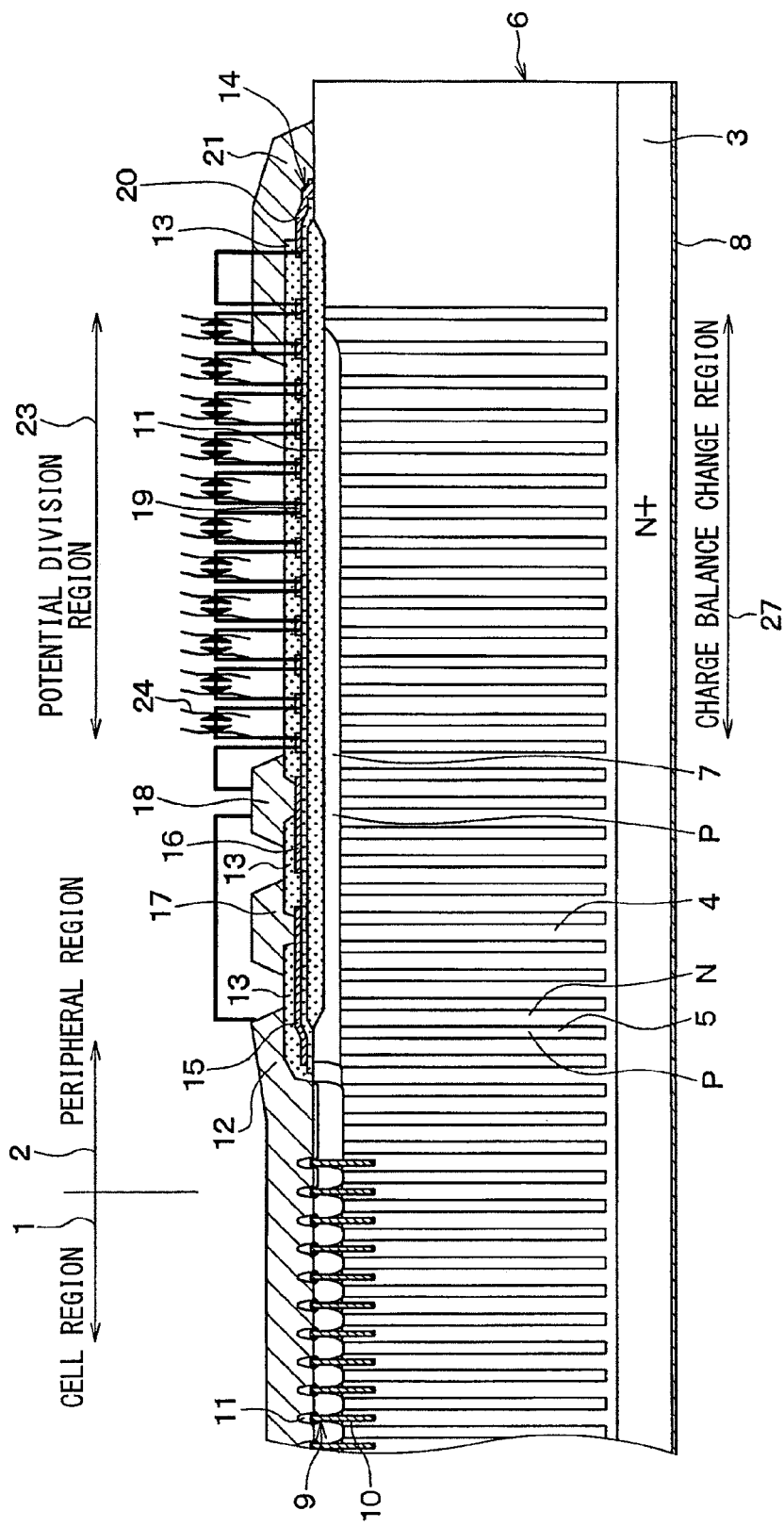
FIG. 15 is a cross-sectional view of a semiconductor device according to a seventh embodiment of the present disclosure.

As shown in FIG. 15, it is also possible to form the N-type column regions 4 and the P-type column regions 5 up to the front surface of the semiconductor substrate 6 and form the P-type layer 7 not by epitaxial growth, but by ion implantation.

When the P-type layer 7 is formed by ion implantation, the N-type column regions 4 are formed up to the front surface of the semiconductor substrate 6. Therefore, it is possible to achieve electrical connection between the N-type epitaxial region around the drift region and the outermost peripheral electrode 21 without forming the N$^+$-type region 22 (see FIG. 2) shown in the first embodiment.

Eighth Embodiment

A semiconductor device according to an eighth embodiment of the present disclosure will be described with reference to FIG. 16.

Figure 16:
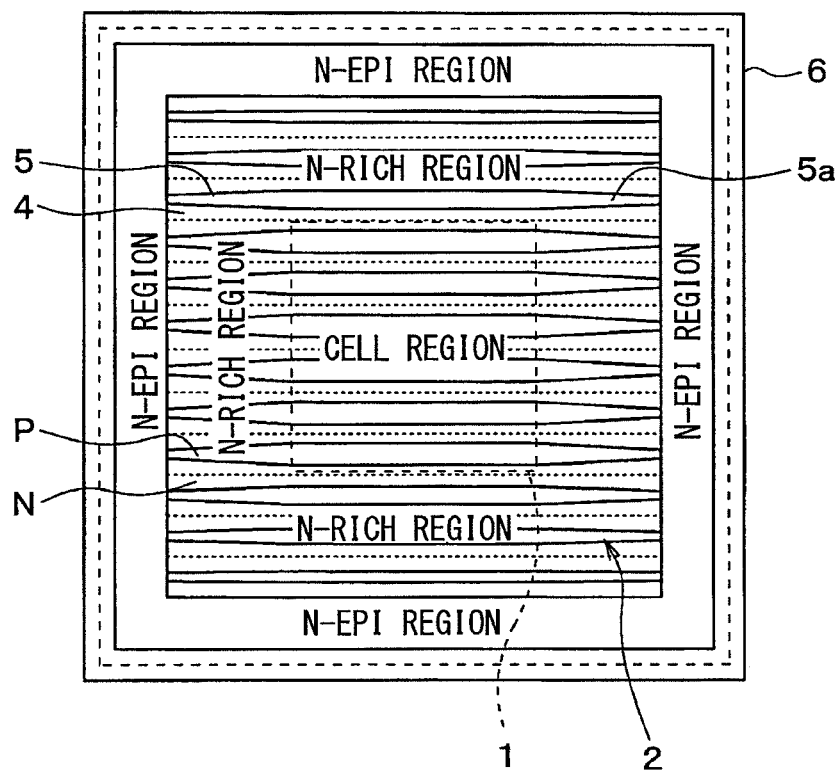
FIG. 16 is a plan view of a semiconductor device according to an eighth embodiment of the present disclosure.

As shown in FIG. 16, in the semiconductor device of the present embodiment, in the column repetition direction, the pitch between the individual columns is held constant with distance from the cell region 1 toward the outer peripheral direction without being changed, while the widths of the P-type column regions 5 are reduced with distance from the cell region 1 toward the outer peripheral direction. Also, in a direction perpendicular to the repetition direction, the end portions 5a of the P-type column regions 5 are tapered, and the taper angles of the tapered portions are reduced with decrease in the widths of the P-type column regions 5, that is, toward the outer peripheral direction of the cell region 1 in the repetition direction.

Since the taper angles of the end portions 5a are reduced with decrease in the widths of the P-type column regions 5, it is possible to restrict an electric field from being concentrated on corner portions when the whole SJ structure is assumed to have a quadrilateral shape (hereinafter referred to simply as the corner portions of the SJ structure).

Also, by gradually decreasing the widths of the P-type column regions 5, it is possible to continuously change the balance between the impurity concentrations in the N-type column regions 4 and the P-type column regions 5 with distance from the cell region 1 toward the outer peripheral direction.

Even when the widths of the P-type column regions 5 are changed in the column repetition direction, the N-type impurity concentration can be continuously changed to be larger than the P-type impurity concentration with distance from the cell region 1 toward the outer peripheral direction, while the peripheral region 2 is provided as an N-rich region where N-type carriers are dominant. As a result, the same effect as obtained in the first embodiment can be obtained.

Ninth Embodiment

A semiconductor device according to a ninth embodiment of the present disclosure will be described with reference to FIG. 17(a) and FIG. 17(b).

Figure 17A:
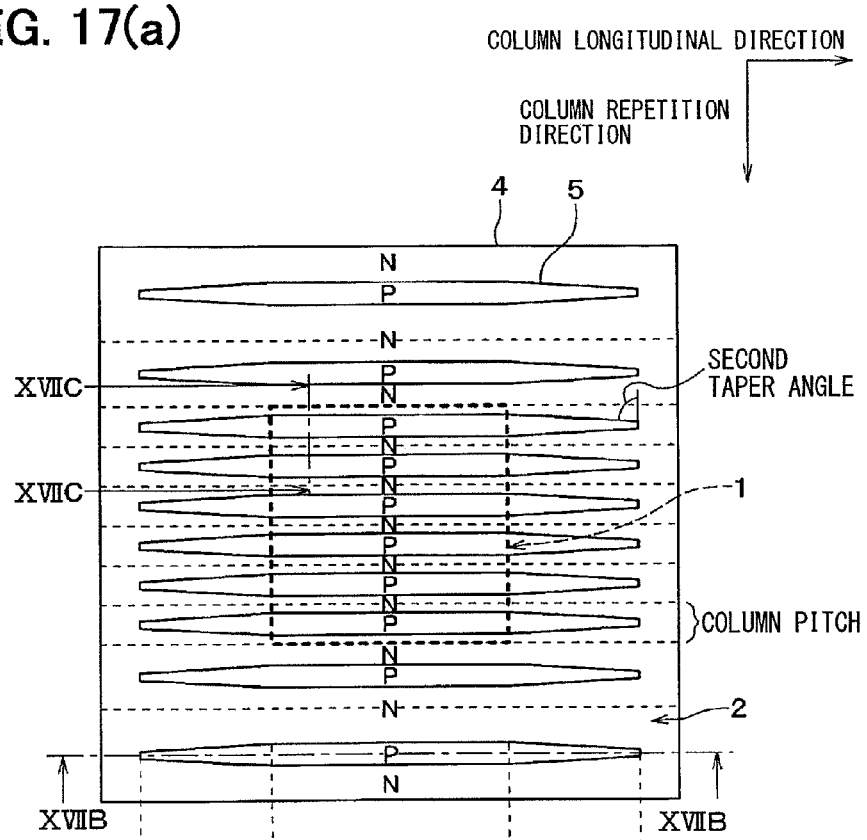
FIG. 17(a) is a planar layout diagram of an SJ structure in a semiconductor device according to a ninth embodiment of the present disclosure.

As shown in FIG. 17(a), in the present embodiment, a lateral direction over a paper sheet with FIG. 17(a) is assumed to be a longitudinal direction (hereinafter referred to as a column longitudinal direction), and the N-type column regions 4 and the P-type column regions 5, which form the SJ structure, are repeatedly and alternately arranged all over the cell region 1 and the peripheral region 2 in a direction perpendicular to the column longitudinal direction (hereinafter the direction perpendicular to the column longitudinal direction is referred to as a column repetition direction).

In the cell region 1, the ratio between the charge amount in the P-type column regions 5 and the charge amount in the N-type column regions 4 is set to 1:1. The depths (column depths) of the N-type column regions 4 and the P-type column regions 5 are set to, for example, 45 μm, and a column pitch as a repetition unit of the PN columns is set to 6.0 μm.

Figure 17B:
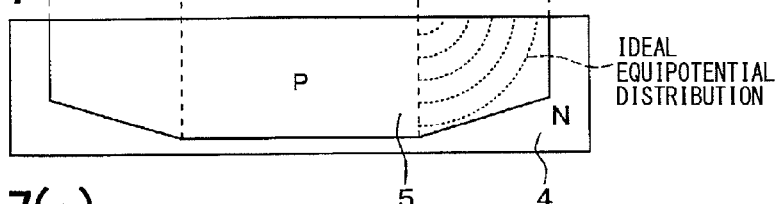
FIG. 17(b) is a cross-sectional view of the SJ structure taken along the line XVIIB-XVIIB of FIGS. 17(a), and 17(c) is a cross-sectional view of the SJ structure taken along the line XVIIB-XVIIB of FIG. 17(a)
Figure 17C:
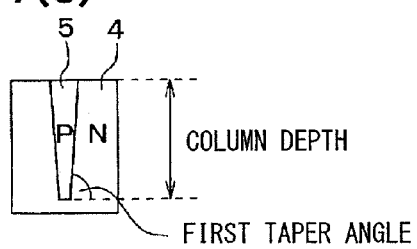

Also, as shown in FIG. 17(c), the boundary surface between the N-type column region 4 and the P-type column region 5 is formed as a tapered surface which is inclined in the depth direction to show a tapered shape which is narrowed with depth of the P-type column region 5. The angle (hereinafter referred to as a first taper angle) between a boundary line, which is included in the boundary surface formed as the tapered surface and passes through a cut surface along the column repetition direction, and the column repetition direction is set to, for example, 89.6°.

The impurity concentrations in the N-type column regions 4 and the P-type column regions 5 are equalized to equalize the P-type charge amount and the N-type charge amount in the adjacent PN columns as a whole and provide the same charge balance condition in the PN columns. For example, the impurity concentration in each of the N-type column regions 4 and the P-type column regions 5 is set to $8.0 \times 10^{15}$ cm$^{-3}$.

Note that, since the boundary surface between the N-type column region 4 and the P-type column region 5 is formed as the tapered surface, a charge balance change structure in which the N-type charge amount in the N-type column regions 4 gradually increases to be larger than the P-type charge amount in the P-type column regions 5 in the depth direction is provided. However, the P-type charge amount and the N-type charge amount are equalized in the N-type column regions 4 and the P-type column regions 5 throughout the entire depths thereof. As a result, in the cell region 1, a charge balance change structure in which the same charge balance condition is provided in the PN columns as a whole and the N-type charge amount gradually increases to be larger than the P-type charge amount in the depth direction is provided.

On the other hand, the peripheral region 2 is provided with a region where the balance between the charge amounts in the N-type column regions 4 and the P-type column regions 5 continuously changes with distance from the cell region 1 toward the outer peripheral direction. The region is provided under the P-type layer 7 (on the drain layer 3 side) to serve as the charge balance change region 27 where the charge balance is changed. Note that the outermost peripheral electrode 21 is located around the charge balance change region 27.

In the charge balance change region 27, in the column longitudinal direction and the column repetition direction, the balance between the charge amounts in the N-type column regions 4 and the P-type column regions 5 is continuously changed with distance from the cell region 1 toward the outer peripheral direction using different structures. Specifically, the ratio of the volume of the N-type column region 4 to the volume of the P-type column region 5 is increased to provide the peripheral region 2 as the N-rich region where the N-type charge amount is dominant, while the N-type charge amount is continuously changed to be larger than the P-type charge amount with distance from the cell region 1 toward the outer peripheral direction.

In the column longitudinal direction, as shown in FIG. 17(a), the boundary line between the N-type column region 4 and the P-type column region 5 in a substrate horizontal plane is inclined with respect to the column repetition direction to show a tapered shape in which the widths of the P-type column regions 5 gradually decreases. The angle (hereinafter referred to as a second taper angle) formed between the boundary line and the column repetition direction is set to, for example, 89.8°. The second taper angle is set larger than the first taper angle (the second taper angle>the first taper angle). By setting the second taper angle larger than the first taper angle, the intervals between the equipotential lines are larger in the peripheral region 2 than in the cell region 1 to reduce the concentration of an electric field. Accordingly, the breakdown voltage can be higher in the peripheral region 2 than in the cell region 1.

Figure 18:
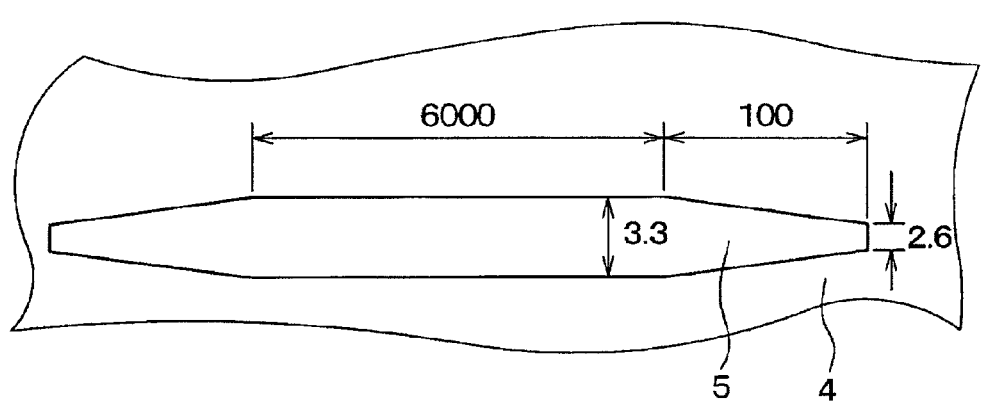
FIG. 18 is a surface layout diagram showing an example of the dimensions of a P-type column region 5.

As shown in FIG. 18, in the P-type column region 5, a portion located in the cell region 1 and having a constant width has a dimension of 6000 μm in the column longitudinal direction and a dimension of 3.3 μm in the column repetition direction and a portion having a gradually reduced width has a dimension of 100 μm in the column longitudinal direction and a dimension of 2.6 μm in the column repetition direction. Thus, in the column longitudinal direction, by changing the width of the P-type column region 5, the balance between the charge amounts in the N-type column regions 4 and the P-type column regions 5 is continuously changed with distance from the cell region 1 toward the outer peripheral direction.

Note that the depths of the P-type column regions 5 may be set equal in the cell region 1 and the peripheral region 2. However, as shown in FIG. 17(b), in the present embodiment, the depths are gradually smaller with distance from the cell region 1 toward the outer periphery. Since the P-type column regions 5 are configured by forming trenches in the N-type column region 4 and then embedding P-type layers therein, reductions in the widths of the P-type column regions 5 cause a micro-loading effect so that the depths are shallower with reductions in the widths.

In the column repetition direction, the dimensions of the P-type column regions 5 are prevented from changing from those in the cell region 1, while the column pitch thereof is increased to be larger than the column pitch in the cell region 1 with distance from the cell region 1 toward the outer peripheral direction. By gradually increasing the column pitch, the balance between the charge amounts in the N-type column regions 4 and the P-type column regions 5 is continuously changed with distance from the cell region 1 toward the outer peripheral direction.

In the present embodiment, the potential division region 23 is disposed so as to overlap the charge balance change region 27 in the thickness direction of the semiconductor substrate 6.

Figure 19A:
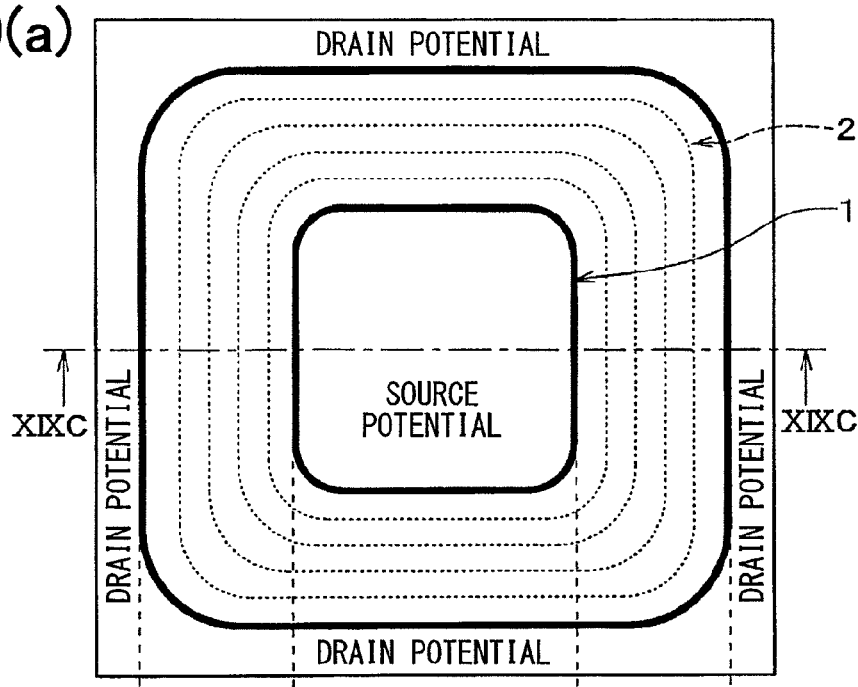
FIG. 19(a) is a plan view showing a potential distribution in the semiconductor device.
Figure 19B:
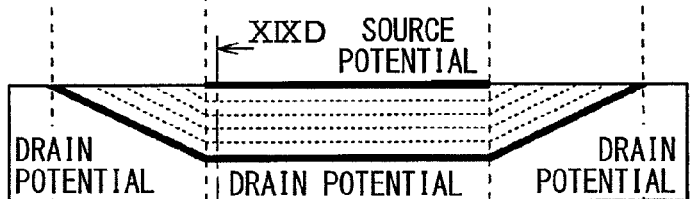
FIG. 19(b) is a cross-sectional view showing a potential distribution in the semiconductor device.
Figure 19C:
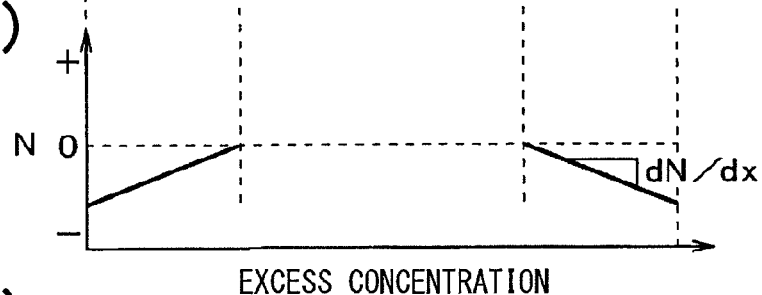
FIG. 19(c) is a diagram showing the distribution of an excess concentration in a cross section taken along the line XIXC-XIXC of FIG. 19(a)
Figure 19D:
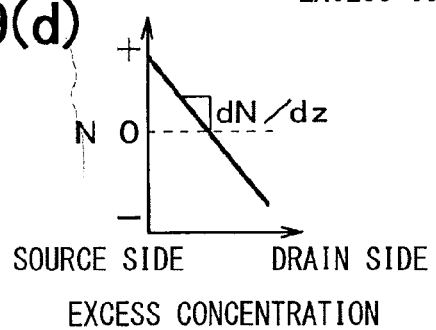
FIG. 19(d) is a diagram showing the distribution of the excess concentration in a cross section taken along the line XIXD-XIXD of FIG. 19(b)

In a semiconductor device having such a configuration, a potential distribution and the distribution of the excess concentration (the excess concentration=(the P-type charge amount−the N-type charge amount)/the column pitch) are as shown in FIG. 19(a) through FIG. 19(d). Since the charge balance change region 27 is provided, as shown in FIG. 19(c) and FIG. 19(d), the excess concentration in each of the XIXC-XIXC cross section and the XIXD-XIXD cross section in FIG. 19(a) and FIG. 19(b) decreases with distance from the cell region 1 toward the outer peripheral direction and decreases with the depth in the depth direction. Consequently, as shown in FIG. 19(a) and FIG. 19(b), the intervals between the equipotential lines shown by the broken lines in the drawings are larger in the peripheral region 2 than in the cell region 1 to reduce the concentration of the electric field. Accordingly, it is possible to set the breakdown voltage higher in the peripheral region 2 than in the cell region 1.

Figure 20:
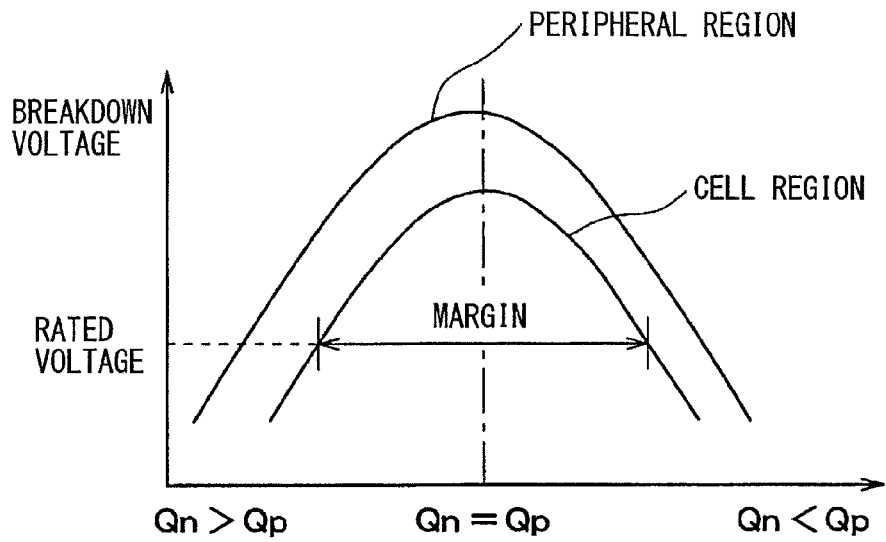
FIG. 20 is a view showing the relationship between a charge imbalance and a breakdown voltage.

As a result, as can be seen from the diagram of the relationship between the charge imbalance and the breakdown voltage shown in FIG. 20, the breakdown voltage is not lower even on the outer peripheral side of the peripheral region 2 than in the cell region 1, and the peripheral region 2 does not reduce a charge balance margin in the cell region 1. Therefore, it is possible to provide a semiconductor device in which the peripheral region 2 is restricted from reducing the charge balance margin in the cell region 1 and a breakdown voltage yield can be improved.

In the front end portion of the P-type column region 5, in an ideal equipotential distribution, the equipotential lines terminate one after another on the front surface side, as shown in FIG. 17(b). In contrast, in the present embodiment, the depths of the P-type column regions 5 are gradually shallower with the distance from the cell region 1 toward the outer periphery to allow the shapes of the P-type column regions 5 to be closer to the shape of the ideal equipotential distribution. Therefore, it is possible to further reduce the concentration of the electric field and further improve the breakdown voltage.

Tenth Embodiment

A semiconductor device according to a tenth embodiment of the present disclosure will be described with reference to FIG. 21. The present embodiment is obtained by modifying a manner of changing the charge balance in the column repetition direction with respect to the ninth embodiment and is otherwise the same as the ninth embodiment. Thus, a description will be given only of a portion different from that in the ninth embodiment.

Figure 21:
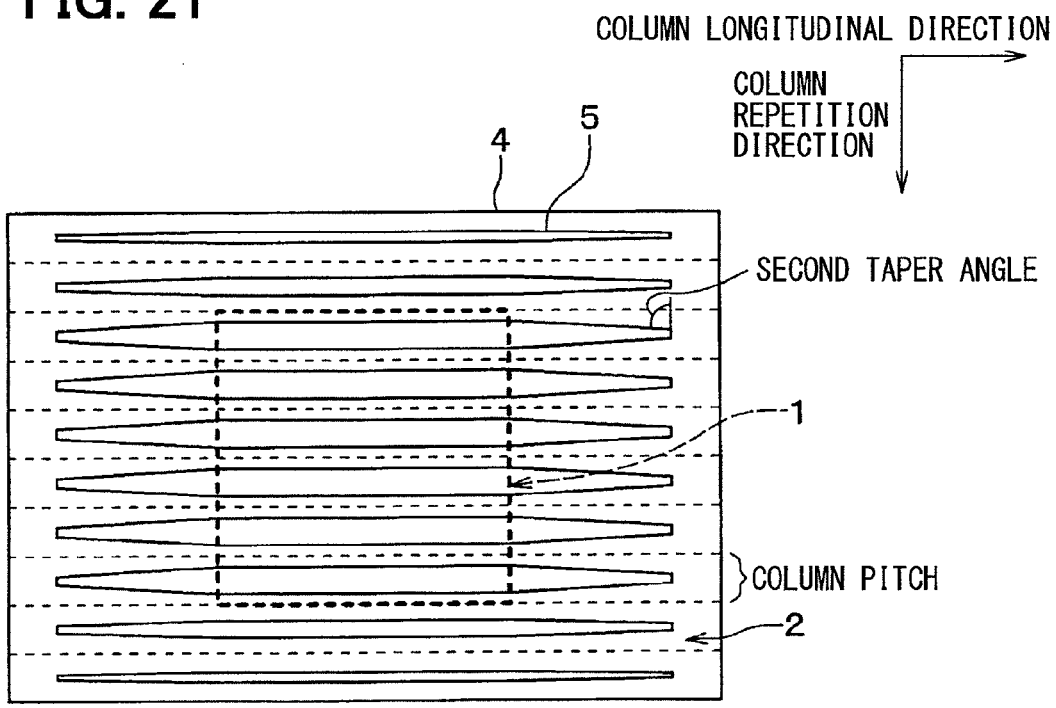
FIG. 21 is a planar layout diagram of an SJ structure in a semiconductor device according to a tenth embodiment of the present disclosure.

As shown in FIG. 21, in the semiconductor device of the present embodiment, in the column repetition direction, the column pitch is held constant without being changed with distance from the cell region 1 toward the outer peripheral direction, while the widths of the P-type column regions 5 are reduced with distance from the cell region 1 toward the outer peripheral direction. By gradually reducing the widths of the P-type column regions 5, the balance between the charge amounts in the N-type column regions 4 and the P-type column regions 5 is continuously changed with distance from the cell region 1 toward the outer peripheral direction.

Even when the widths of the P-type column regions 5 are changed in the column repetition direction, it is possible to provide the peripheral region 2 as the N-rich region where the N-type charge amount is dominant and also continuously change the N-type charge amount such that the N-type charge amount is larger than the P-type charge amount with distance from the cell region 1 toward the outer peripheral direction. Therefore, the same effect as obtained in the ninth embodiment can be obtained.

Eleventh Embodiment

Figure 22A:
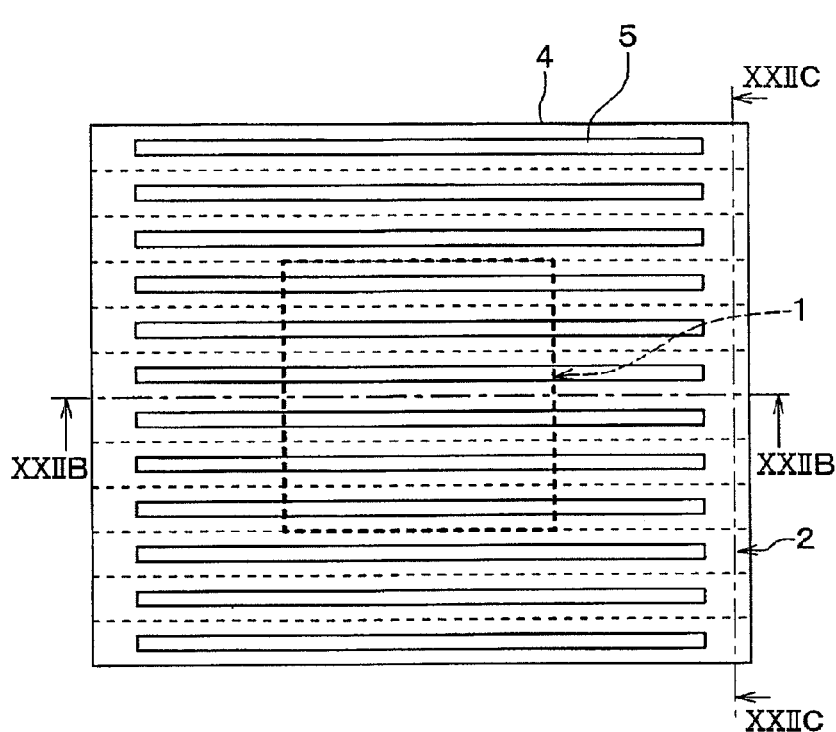
FIG. 22(a) is a planar layout diagram of an SJ structure in a semiconductor device according to an eleventh embodiment of the present disclosure.
Figure 22C:
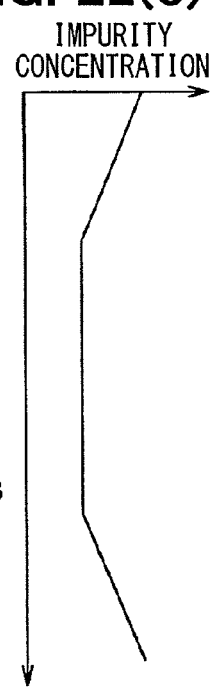
FIG. 22(b) is a view showing an impurity concentration distribution in an N-type column region in a cross section taken along the line XXIIB-XXIIB of FIGS. 22(a), and 22(c) is a diagram showing an impurity concentration distribution in the N-type column region in a cross section taken along the line XXIIC-XXIIC.
Figure 22B:
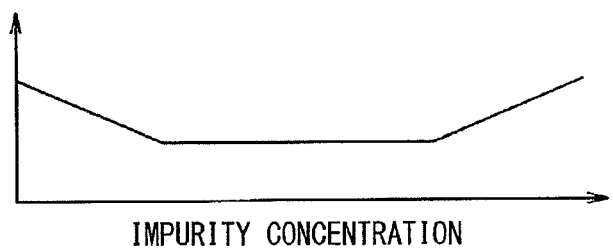

A semiconductor device according to an eleventh embodiment of the present disclosure with reference to FIG. 22(a) through FIG. 22(c). The present embodiment is obtained by modifying the SJ structure in the ninth embodiment and is otherwise the same as the ninth embodiment. Thus, a description will be given only of a portion different from that in the ninth embodiment.

As shown in FIG. 22(a), in the present embodiment, the lateral direction over a paper sheet with FIG. 22(a) is assumed to be the column longitudinal direction, and the widths of the P-type column regions 5 are held constant from the cell region 1 to the peripheral region 2 in the column longitudinal direction. However, in the peripheral region 2, the impurity concentration in the N-type column regions 4 is changed in the column longitudinal direction and the column repetition direction such that the charge amount in the N-type column regions 4 increases with distance from the cell region 1 toward the outer peripheral direction.

Even when the impurity concentration in the N-type column regions 4 are increased with distance from the cell region 1 toward the outer peripheral direction, it is possible to provide the peripheral region 2 as the N-rich region where the N-type charge amount is dominant and also continuously change the N-type charge amount such that the N-type charge amount is larger than the P-type charge amount with distance from the cell region 1 toward the outer peripheral direction. Therefore, the same effect as obtained in the ninth embodiment can be obtained.

Twelfth Embodiment

A semiconductor device according to a twelfth embodiment of the present disclosure will be described with reference to FIG. 23. The present embodiment is obtained by modifying the SJ structure in the peripheral region 2 in the ninth embodiment and is otherwise the same as the ninth embodiment. Accordingly, a description will be given only of a portion different from that in the ninth embodiment.

Figure 23:
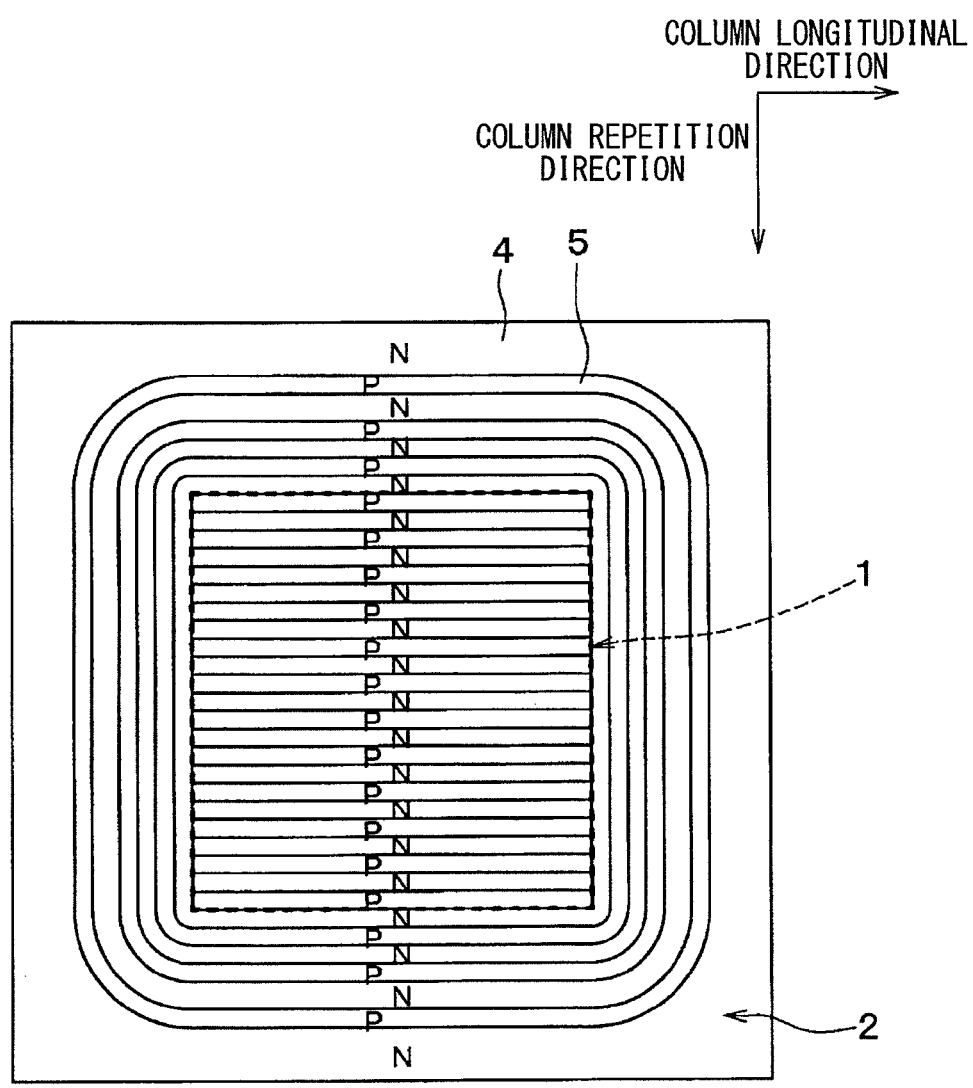
FIG. 23 is a planar layout diagram of an SJ structure in a semiconductor device according to a twelfth embodiment of the present disclosure.

As shown in FIG. 23, in the present embodiment, the cell region 1 is provided with a SJ structure in which the lateral direction over a paper sheet with FIG. 23 is assumed to be the column longitudinal direction, a direction perpendicular to the column longitudinal direction is assumed to be the column repetition direction, and the N-type column regions 4 and the P-type column regions 5 are repeatedly arranged. On the other hand, in the peripheral region 2, the P-type column regions 5 are provided in a multi-round frame shape so as to surround the periphery of the cell region 1. In the case of the present embodiment, because the cell region 1 has a quadrilateral shape, the P-type column regions 5 in the peripheral region 2 also have quadrilateral frame shapes and have rounded corner portions so as to allow a reduction in the concentration of an electric field in the corner portions.

In such a structure, the intervals between the P-type column regions 5 arranged in the multi-round frame shape are increased toward the outer peripheral direction of the cell region 1. Thus, the charge amount in the N-type column regions 4 is increased with distance from the cell region 1 toward the outer peripheral direction.

Even when the intervals between the P-type column regions 5 arranged in the multi-round frame shape are increased toward the outer peripheral direction of the cell region 1, it is possible to provide the peripheral region 2 as the N-rich region where the N-type charge amount is dominant and also continuously change the N-type charge amount such that the N-type charge amount is larger than the P-type charge amount with distance from the cell region 1 toward the outer peripheral direction. Therefore, the same effect as obtained in the ninth embodiment can be obtained.

Thirteenth Embodiment

A semiconductor device according to a thirteenth embodiment of the present disclosure will be described with reference to FIG. 24. The present embodiment is obtained by modifying the SJ structure in the ninth embodiment and is otherwise the same as the ninth embodiment. Accordingly, a description will be given only of a portion different from that in the ninth embodiment.

Figure 24:
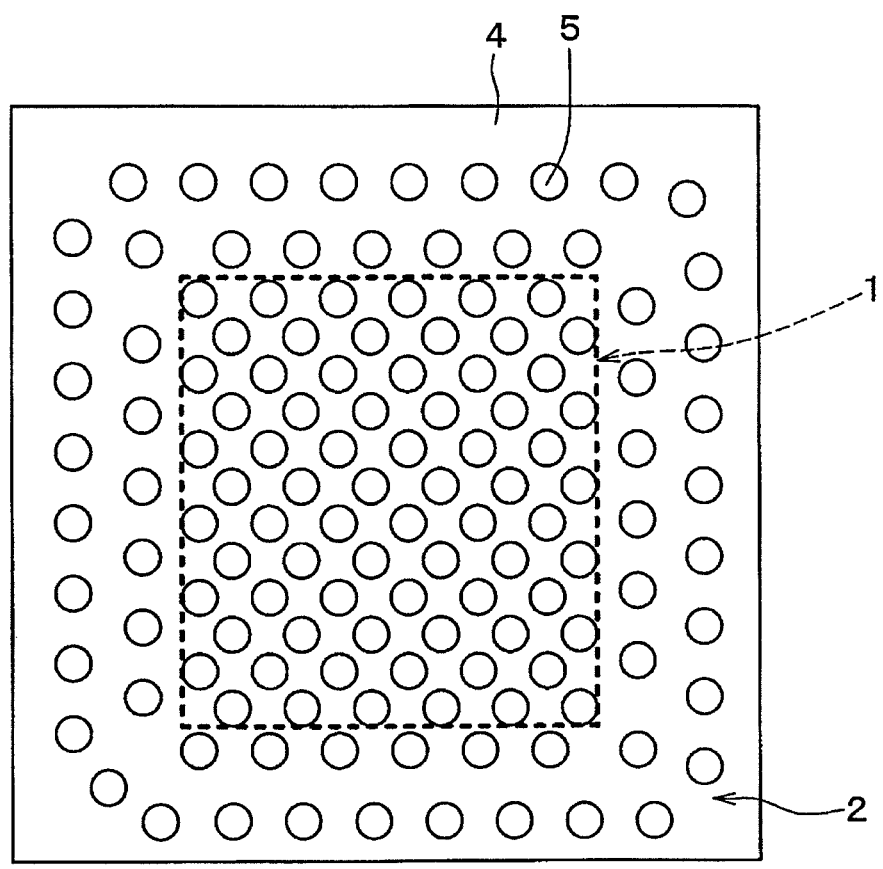
FIG. 24 is a planar layout diagram of an SJ structure in a semiconductor device according to a thirteenth embodiment of the present disclosure.

As shown in FIG. 24, in the present embodiment, in both of the cell region 1 and the peripheral region 2, the P-type column regions 5 are scattered in a dotted shape. In the cell region 1, the column ratio between the N-type column regions 4 and the P-type column regions 5 is set to 1:1. On the other hand, in the peripheral region 2, the ratio of the P-type column regions 5 formed therein is set lower than the ratio of the P-type column regions 5 formed in the cell region 1 and is gradually reduced with distance from the cell region 1 toward the outer peripheral direction. Thus, the charge amount in the N-type column regions 4 is increased with distance from the cell region 1 toward the outer peripheral direction.

By providing such a configuration, even when an SJ structure does not include striped PN columns, but a structure in which the P-type column regions 5 are arranged in the dotted shape is provided, it is possible to provide the peripheral region 2 as the N-rich region where the N-type charge amount is dominant and also continuously change the N-type charge amount such that the N-type charge amount is larger than the P-type charge amount with distance from the cell region 1 toward the outer peripheral direction. Therefore, the same effect as obtained in the ninth embodiment can be obtained.

Other Embodiments

The configuration of the semiconductor device shown in each of the foregoing embodiments is illustrative. The semiconductor device is not limited to the configurations described above and may also have another configuration capable of implementing the present disclosure. For example, the semiconductor elements are not limited to the MOSFETs and may also be diodes or the like. The MOSFETs may also be of planar types, not the trench-gate types.

Also in a structure in which the resistors 28 are used as the potential division elements, the N-type column regions 4 in the charge balance change region 27 are not limited to the layout shown in FIG. 4(b) and may also have the layout shown in FIG. 10(b).

In each of the foregoing embodiments, the entire potential division region 23 overlaps the charge balance change region 27 when viewed from the thickness direction of the semiconductor substrate 6. However, this is an example of the placement, and at least a part of the potential division region 23 may appropriately overlap the peripheral region 2, preferably the charge balance change region 27 when viewed from the thickness direction of the semiconductor substrate 6. That is, when the potential division region 23 is disposed at least over the peripheral region 2, it is possible to achieve a shielding effect against the influence of the charges trapped in the peripheral region 2 and consequently prevent variations in breakdown voltage. Accordingly, it is possible to ensure the breakdown voltage without allowing an electric field to be concentrated on the peripheral region 2. When the potential division region 23 is provided so as to overlap the charge balance change region 27, it is possible to match the potential distribution in the silicon surface and the surface potential distribution defined by the guard rings 19 so that no difference is produced in breakdown voltage depending on the presence/absence of the guard rings. As a result, the effect of being able to ensure a wider charge balance margin against the deterioration of the breakdown voltage can be obtained.

In the first embodiment, the structure in which the voltage between the outermost peripheral electrode 21 (drain electrode 8) and the source electrode 12 is divided in the potential division region 23 is provided. However, the structure may also be such that the voltage between the outermost peripheral electrode 21 (drain electrode 8) and the gate electrode 17 is divided in the same manner as in the fourth embodiment. Accordingly, a lead-out electrode from the gate can be used, a region for the relay electrode 18 which leads out an electrode from the source is unnecessary, and an area of the semiconductor device can be reduced by the region.

Also, in the first embodiment, the potential division is performed using the zener diodes 24 as the potential division elements. However, in the same manner as in the fourth embodiment, the resistors 28 may also be used.

In each of the foregoing embodiments, the balance between the impurity concentrations continuously changes in the charge balance change region 27. However, the continuous changing of the balance between the impurity concentrations may also be started from a region of the peripheral region 2 located closer to the cell region 1 than the charge balance change region 27. That is, the charge balance change region 27 of the peripheral region 2 may also be adjacent to the cell region 1. As a result, the equipotential lines start to be curved on the cell region 1 side to restrict a difference between the amount of carriers supplied to the cell region 1 and the amount of carriers supplied to the peripheral region 2 when a high carrier-injected state has occurred. Depending on the structure of the charge balance change region 27, it may also be possible to change the N-type impurity concentration in the N-type epitaxial region located around the drift region.

For example, in the structure shown in FIG. 4(b), the widths of the P-type column regions 5 arranged in the repetition direction are held constant and the taper angles of the end portions 5a each having a tapered shape are also held constant. In addition, the pitch between the P-type column regions 5 is increased toward the outer peripheral direction of the cell region 1 in the repetition direction. In the case of providing such a structure, in both of the repetition direction and the direction perpendicular to the repetition direction, the ratio of the N-type impurity concentration to the P-type impurity concentration increases toward the outer peripheral direction of the cell region 1.

Accordingly, when the ratio of the N-type impurity concentration is increased in the corner portions of the SJ structure using the same rate as used to increase the ratio of the N-type impurity concentration in the repetition direction and the direction perpendicular to the repetition direction, the ratio of the N-type impurity concentration is higher than in the other portion of the charge balance change region 27. That is, the corner portions have the ratio obtained by multiplying the ratio of the N-type impurity concentration in the repetition direction by the ratio of the N-type impurity concentration in the direction perpendicular to the repetition direction so that the ratio of the N-type impurity concentration undesirably becomes higher.

Figure 25A:
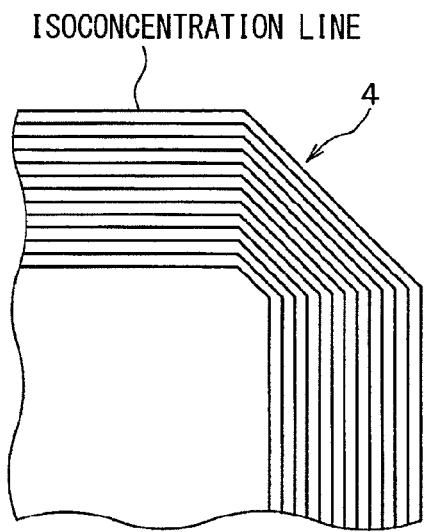
FIG. 25(a) and FIG. 25(b) are plan views each showing a concentration distribution in an N-type column region in the vicinity of a corner portion in an SJ structure according to another embodiment.

Accordingly, in the case of the structure shown in FIG. 4(b), the ratio of the N-type impurity concentration may be set appropriately for the corner portions by connecting the portions having the same ratios of the N-type impurity concentration in the repetition direction and the portions having the same ratios of the N-type impurity concentrations in the direction perpendicular to the repetition direction. That is, when lines showing locations having the same ratios of the N-type impurity concentrations are defined to be equi-concentration lines, as shown in FIG. 25(a), the equi-concentrations lines may appropriately have tapered shapes in the corner portions. Accordingly, the ratio of the N-type impurity concentration can be restricted from becoming higher in the corner portions than in the other portion of the charge balance change region 27.

In the structure shown in FIG. 16, the widths of the P-type column regions 5 arranged in the repetition direction are gradually reduced, and the taper angles of the end portions 5a each having a tapered shape are also gradually reduced. Also, in the repetition direction, the pitch between the P-type column regions 5 is held constant. Also in the case of providing such a structure, the ratio of the N-type impurity concentration to the P-type impurity concentration increases toward the outer peripheral direction of the cell region 1 in both of the repetition direction and the direction perpendicular to the repetition direction. Accordingly, also in this case, the ratio of the N-type impurity concentration in the corner portions may be set appropriately by connecting the portions having the same ratios of the N-type impurity concentrations to the P-type impurity concentration in the repetition direction and the portions having the same ratios of the N-type impurity concentrations to the P-type impurity concentration in the direction perpendicular to the repetition direction.

Figure 25B:
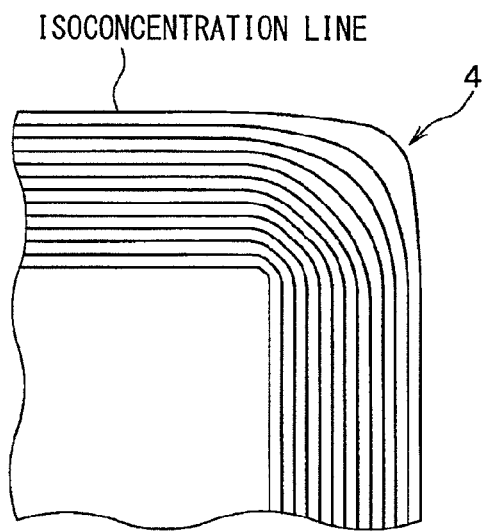
Figure 26A:
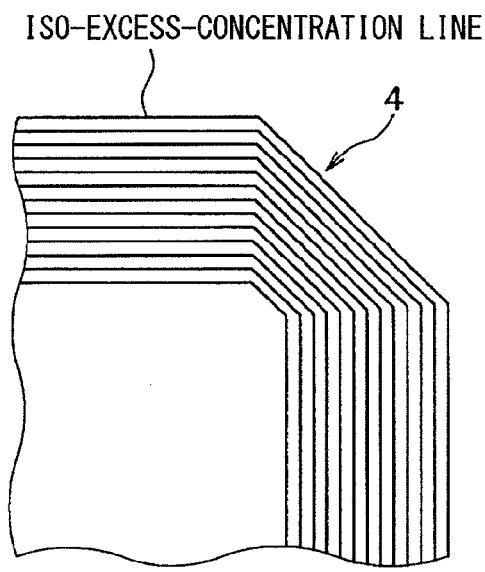
FIG. 26(a) and FIG. 26(b) are plan views each showing an excess concentration distribution in the vicinity of the corner portion in the SJ structure according to the other embodiment.
Figure 26B:
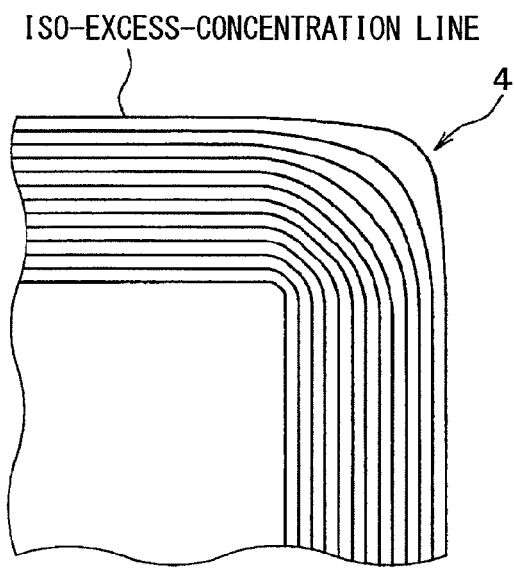

However, compared to the structure of FIG. 4(b), even when the ratio of the N-type impurity concentration is increased in the corner portions of the SJ structure using the same rate as used to increase the ratio of the N-type impurity concentration in the repetition direction and the direction perpendicular to the repetition direction, the degree of which the ratio of the N-type impurity concentration increases is low. Accordingly, as shown in FIG. 25(b), the equi-concentration lines in the corner portions are provided with shapes each having a curvature which gradually increases toward the outer peripheral direction of the cell region 1. Accordingly, the ratio of the N-type impurity concentration can be restricted from becoming higher in the corner portions than in the other portion of the charge balance change region 27.

Note that, in each of the foregoing embodiments, the concentrations of the N-type impurity and the P-type impurity forming the N-type column regions 4 and the P-type column regions 5 are constant and the regions (volumes) in which the N-type column regions 4 and the P-type column regions 5 are formed are changed toward the outer peripheral direction of the cell region 1 to configure the charge balance change region 27. This is because, when the N-type impurity and the P-type impurity forming the N-type column regions 4 and the P-type column regions 5 have constant concentrations, the manufacturing process thereof can be rather simplified. However, if the manufacturing process of the N-type column regions 4 and the P-type column regions 5 is performed in a plurality of separate steps for the different impurity concentrations, the concentrations of the N-type impurity and the P-type impurity forming these can also be changed. Accordingly, it may also be possible to change the concentrations of the N-type impurity and the P-type impurity forming the N-type column regions 4 and the P-type column regions 5 toward the outer peripheral direction of the cell region 1 to configure the charge balance change region 27.

In short, in the charge balance change region 27, the charge amount may decrease appropriately toward the outer peripheral direction of the cell region 1. Accordingly, it may also be possible to, for example, hold the P-type impurity concentration in the P-type column regions 5 constant and also increase the N-type impurity concentration in the N-type column regions 4 toward the outer peripheral direction of the cell region 1.

Likewise, in the case of a structure in which the P-type column regions 5 are scattered in a dotted shape as in the sixth and thirteenth embodiments, it may also be possible to reduce the region (volume) in which dots forming the P-type column regions 5 are formed toward the outer peripheral direction of the cell region 1 to configure the charge balance change region 27.

Also for the SJ structure, it is not limited to the structure described above. That is, the structure is appropriate as long as, in the cell region 1, the P-type charge amount and the N-type charge amount in the adjacent PN columns as a whole are equalized, the peripheral region 2 is provided as the N-rich region where the N-type charge amount is dominant, and the N-type charge amount is continuously changed to be larger than the P-type charge amount with distance from the cell region 1 toward the outer peripheral direction.

In each of the foregoing embodiments, the description has been given of the case where the first conductivity type is the N-type and the second conductivity type is the P-type. However, the present disclosure is applicable even to a semiconductor device in which the first conductivity type is the P-type and the second conductivity type is the N-type. That is, even to a structure in which the conductivity types of the individual members described in each of the foregoing embodiments are inverted, the present disclosure is applicable.

It is also preferable that, depending on the structure of the charge balance change region 27, the gradient of the excess concentration in the corner portions is reduced to be smaller than the gradient of the excess concentration in the repetition direction and the direction perpendicular to the repetition direction.

For example, in the structure shown in FIG. 17(a), the widths of the P-type column regions 5 arranged in the repetition direction are held constant and the taper angle of each of the end portions having the tapered shapes are also held constant. Also, the pitch between the P-type column regions 5 is increased toward the outer peripheral direction of the cell region 1 in the repetition direction. In the case of providing such a structure, in both of the repetition direction and the direction perpendicular to the repetition direction, the excess concentration decreases toward the outer peripheral direction of the cell region 1.

Figure 27:
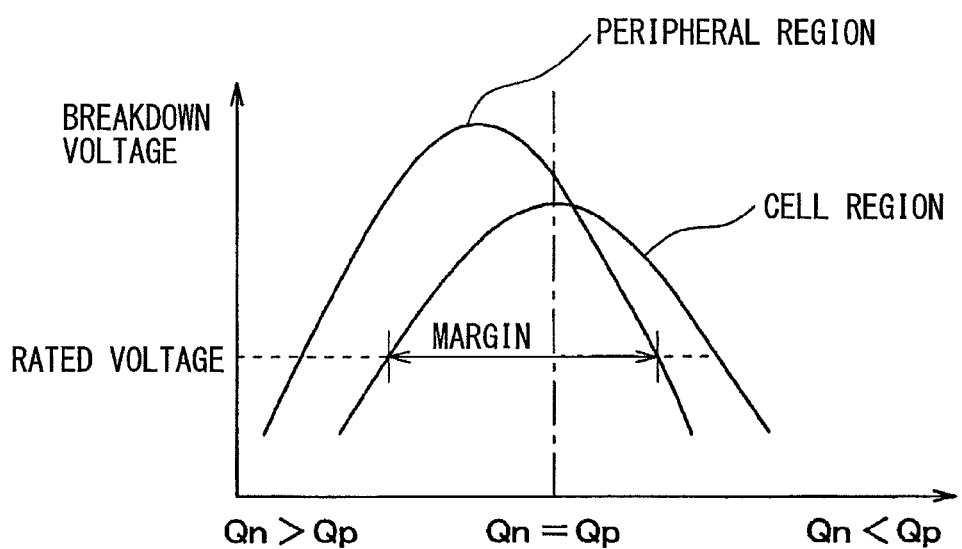
FIG. 27 is a view showing the relationship between a charge imbalance and a breakdown voltage.

Accordingly, in the corner portions of the structure shown in FIG. 17(a), the gradient of the excess concentration is larger than in the charge balance change region 27 in the repetition direction and the direction perpendicular to the repetition direction. That is, in the corner portions, the excess concentration corresponds to the sum of the excess concentrations in the repetition direction and in the direction perpendicular thereto so that the gradient of the excess concentration is larger. When the portions having the same excess concentrations in the repetition direction and the portions having the same excess concentrations in the direction perpendicular to the repetition direction are connected with lines, the lines showing the locations having the same excess concentrations are defined to be equi-excess-concentration lines. In the case of the structure shown in FIG. 17(a), the equi-excess-concentration lines in the corner portions are as shown in FIG. 27(a). The equi-excess-concentration lines in the corner portions are denser than in the repetition direction and the perpendicular direction. This indicates that the breakdown voltage in the corner portions is lower than the breakdown voltages in the repetition direction and the perpendicular direction.

Accordingly, as shown in FIG. 27(b), the column shapes of the P-column regions 5 and the N-column regions 4 are formed in which the curvatures gradually increase as the equi-excess-concentration lines in the corner portions are closer to the outer peripheral direction of the cell region 1. As a result, the equi-excess-concentration lines in the corner portions are sparser than in the repetition direction and the perpendicular direction. This means that the breakdown voltages in the corner portions are higher than the breakdown voltages in the repetition direction and in the perpendicular direction and a more ideal structure can be provided.

As described above, in each of the foregoing embodiments, the concentrations of the N-type impurity and the P-type impurity forming the N-type column regions 4 and the P-type column regions 5 are constant and the regions (volumes) in which the N-type column regions 4 and the P-type column regions 5 are formed are changed toward the outer peripheral direction of the cell region 1 to configure the charge balance change region 27. Likewise, the regions (volumes) in which the N-type column regions 4 and the P-type column regions 5 are formed are changed in the depth direction to configure a charge balance change structure in which the charge balance is changed even in the depth direction. This is because, when the N-type impurity and the P-type impurity forming the N-type column regions 4 and the P-type column regions 5 have constant concentrations, the manufacturing process thereof can be rather simplified. However, if the manufacturing process of the N-type column regions 4 and the P-type column regions 5 is performed in a plurality of separate steps for the different impurity concentrations, the concentrations of the N-type impurity and the P-type impurity forming these can also be changed. Accordingly, it may also be possible to change, as in the eleventh embodiment, the concentrations of the N-type impurity and the P-type impurity forming the N-type column regions 4 and the P-type column regions 5 toward the outer peripheral direction of the cell region 1 such that the P-type impurity concentration is lower than the N-type impurity concentration toward the outer peripheral direction to configure the charge balance change region 27. Likewise, it may also be possible to change the concentrations of the N-type impurity and the P-type impurity forming the N-type column regions 4 and the P-type column regions 5 in the depth direction such that the P-type impurity concentration is lower than the N-type impurity concentration as the depth increases to change the charge balance.

In short, in the charge balance change region 27, the P-type charge amount corresponding to the second-conductivity-type charge amount may gradually decrease appropriately toward the outer peripheral direction of the cell region 1 to be smaller than the N-type charge amount corresponding to the first-conductivity-type charge amount. Also in the depth direction, the P-type charge amount corresponding to the second-conductivity-type charge amount may gradually decrease appropriately with the increase of the depth to be smaller than the N-type charge amount corresponding to the first-conductivity-type charge amount. Accordingly, it may also be possible to, for example, hold the P-type impurity concentration in the P-type column regions 5 constant and also increase the N-type impurity concentration in the N-type column regions 4 toward the outer peripheral direction of the cell region 1.

Note that, in the ninth embodiment, in accordance with the shapes of the N-type column regions 4 and the P-type column regions 5 described in the ninth embodiment, the relationship between the N-type charge amount and the P-type charge amount has been described as the magnitude relationship between the first taper angle and the second taper angle. Specifically, in the ninth embodiment, with regard to the charge balance change region 27, the second taper angle is set larger than the first taper angle to be able to provide the breakdown voltage in the peripheral region 2 which is higher than the breakdown voltage in the cell region 1. However, even when the concentrations of the N-type impurity and the P-type impurity forming the structures of the tenth to fourteenth embodiments or the N-type column regions 4 and the P-type column regions 5 are changed toward the outer peripheral direction of the cell region 1 or in the depth direction, the same holds true. That is, between the first-conductivity-type column regions (the N-type column regions 4) and the second-conductivity-type column regions (the P-type column regions 5), the following relationship may be established appropriately.

The repetition unit for the first-conductivity-type column regions (N-type column regions 4) and the second-conductivity-type column regions (P-type column regions 5) is assumed to be the column pitch. Also, an excess concentration N is assumed to be given by the excess concentration= (the second-conductivity-type charge amount−the first-conductivity-type charge amount)/the column pitch. In this case, the gradient of the excess concentration in the charge balance change region 27 in a direction from the cell region 1 toward the outer peripheral direction is assumed to be given by $dN/dx=(N1-N2)/x$. In the present expression, N1 is a concentration obtained by dividing, by the column pitch, the difference between the second-conductivity-type charge amount (the P-type charge amount in the P-type column regions 5) and the first-conductivity-type charge amount (the N-type charge amount in the N-type column regions 4) at a boundary position between the cell region 1 and the peripheral region 2, N2 is a concentration obtained by dividing, by the column pitch, the difference between the second-conductivity-type charge amount (the P-type charge amount in the P-type column regions 5) and the first-conductivity-type charge amount (the N-type charge amount in the N-type column regions 4) at a front end (outermost peripheral) position in a direction from the cell region 1 toward the outer peripheral direction, and x is a distance from an outermost peripheral position in the second-conductivity-type column region in the cell region 1 to the front end position therein in the outer peripheral direction. Also, the gradient of the excess concentration in the depth direction in the cell region is assumed to be given by $dN/dz=(N3-N4)/z$. In the present expression, N3 is a concentration obtained by dividing, by the column pitch, the difference between the second-conductivity-type charge amount (the P-type charge amount) and the first-conductivity-type charge amount (the N-type charge amount in the N-type column regions 4) at a surface position in the cell region 1, N4 is a concentration obtained by dividing, by the column pitch, the difference between the second-conductivity-type charge amount (the P-type charge amount) and the first-conductivity-type charge amount (the N-type charge amount in the N-type column regions 4) at a deepest position in the cell region 1, and z is a distance from the surface position to the deepest position in the cell region 1, i.e., the depth of each of the second-conductivity-type column regions.

By satisfying $dN/dx \leq dN/dz$ for each of the gradients of the excess concentrations defined, the intervals between the equipotential lines are wider in the peripheral region 2 than in the cell region 1 and the concentration of the electric field is reduced. Therefore, it is possible to provide the breakdown voltage in the peripheral region 2 which is higher than the breakdown voltage in the cell region 1.

As for an innermost peripheral position in the charge balance change region 27, i.e., a starting point for the change which provides a gradient in the changing of the excess concentration, it is not limited to the boundary position between the cell region 1 and the peripheral region 2. For example, the starting point for the changing of the excess concentration may also be located in the peripheral region 2. In the foregoing embodiment, the boundary position between the cell region 1 and the peripheral region 2 is assumed to be a position at which the charge balance region 27 begins and therefore x is defined as the distance from the boundary position between the cell region 1 and the peripheral region 2 to the outermost periphery of the peripheral region 2. However, basically, x is the distance from the innermost peripheral position in the charge balance change region 27 to the outermost peripheral position therein.

The invention claimed is:

1. A semiconductor device including a cell region and a peripheral region surrounding the cell region, the semiconductor device comprising:
    a semiconductor substrate including a first-conductivity-type layer, and first-conductivity-type column regions and second-conductivity-type column regions formed above the first-conductivity-type layer and serving as a drift region, the first-conductivity-type column regions and the second-conductivity-type column regions forming a super-junction structure, each of the first-conductivity-type column regions having a first-conductivity-type impurity concentration per unit volume, each of the second-conductivity-type column regions having a second-conductivity-type impurity concentration per unit volume, a part of the semiconductor substrate being included in the cell region and other part of the semiconductor substrate being included in the peripheral region;
    a semiconductor element disposed in the cell region;
    an element electrode of the semiconductor element disposed in the cell region;
    an outermost peripheral electrode electrically connected to the semiconductor substrate in the peripheral region;
    a second-conductivity-type layer formed above the super-junction structure in the peripheral region; and
    a potential division region formed above the second-conductivity-type layer to electrically connect the element electrode to the outermost peripheral electrode and also divide a voltage between the element electrode and the outermost peripheral electrode into a plurality of stages, a part of the potential division region overlapping the peripheral region when viewed from a thickness direction of the semiconductor substrate, wherein the peripheral region further includes a charge balance change region in which a difference between the first-conductivity-type impurity concentration and the second-conductivity-type impurity concentration of one section of the charge balance change region is larger than a difference between the first-conductivity-type impurity concentration and the second-conductivity-type impurity concentration of another section of the charge balance change region, the one section being located farther from the cell region than the another section in the peripheral region.

2. The semiconductor device according to claim 1, wherein the potential division region divides the voltage between the element electrode and the outermost peripheral electrode from the element electrode side toward the outermost peripheral electrode side such that a potential distribution in the super-junction structure has equal intervals in a radial direction of the cell region on a plane in which the first-conductivity-type layer extends.

3. The semiconductor device according to claim 1, wherein, in a radial direction of the cell region on a plane in which the first-conductivity-type layer extends, a length of the potential division region from an end portion located on the cell region side to an end portion located on the outermost peripheral electrode side is greater than a depth from a surface of the second-conductivity-type layer to the first-conductivity-type layer.

4. The semiconductor device according to claim 1, wherein the outermost peripheral electrode overlaps the super-junction structure when viewed from the thickness direction of the semiconductor substrate.

5. The semiconductor device according to claim 1, wherein the charge balance change region is adjacent to the cell region.

6. The semiconductor device according to claim 1, wherein the first-conductivity-type column regions and the second-conductivity-type column regions, which form the super-junction structure, are repeatedly arranged in a repetition direction in both of the cell region and the peripheral region, and
wherein, in the peripheral region, each of the second-conductivity-type column regions has one portion and another portion closer to an end portion of the each of the second-conductivity-type column regions than the one portion in a direction perpendicular to the repetition direction in a plane in which the first-conductivity-type layer extends,
wherein a width of the another portion in the direction perpendicular to the repetition direction is smaller than a width of the one portion in the direction perpendicular to the repetition direction, so that, in the charge balance change region, the difference between the first-conductivity-type impurity concentration and the second-conductivity-type impurity concentration of the one section of the charge balance change region is larger than the difference between the first-conductivity-type impurity concentration and the second-conductivity-type impurity concentration of the another section of the charge balance region.

7. The semiconductor device according to claim 6, wherein intervals between the first-conductivity-type column regions and the second-conductivity-type column regions in the repetition direction are same in both of the cell region and the peripheral region, and
wherein, in the peripheral region, a width of one of the second-conductivity-type column regions in the direction perpendicular to the repetition direction is smaller than a width of another one of the second-conductivity-type column regions in the direction perpendicular to the repetition direction, the one of the second-conductivity-type regions being located farther from the cell region than the another one of the second-conductivity-type regions in the repetition direction, so that, in the charge balance change region, the difference between the first-conductivity-type impurity concentration and the second-conductivity-type impurity concentration of the one section of the charge balance change region is larger than the difference between the first-conductivity-type impurity concentration and the second-conductivity-type impurity concentration of the another section of the charge balance change region.

8. The semiconductor device according to claim 1, wherein, in the peripheral region, the first-conductivity-type column regions and the second-conductivity-type column regions, which form the super-junction structure, are laid out in a ring shape surrounding the cell region, while the first-conductivity-type column regions and the second-conductivity-type column regions are repeatedly arranged in a repetition direction toward a side opposite to the cell region, and
wherein, in the peripheral region, a width of one of the first-conductivity-type column regions is larger than a width of another one of the first-conductivity-type column regions, the one of the first-conductivity-type column regions being located farther from the cell region than the another one of the first-conductivity-type column regions in the repetition direction.

9. The semiconductor device according to claim 1, wherein the super-junction structure is configured such that the second-conductivity-type column regions are scattered in a dotted shape in the first-conductivity-type column region,
wherein a ratio between the peripheral region and the second-conductivity-type regions formed in the peripheral region is lower than a ratio between the cell region and the second-conductivity-type regions formed in the cell region, and
wherein a ratio between the peripheral region and the second-conductivity-type regions in the one section of the peripheral region is lower than a ratio between the peripheral region and the second-conductivity-type regions in the another section of the peripheral region, the one section being located farther from the cell region than the another section in the peripheral region in a radial direction of the cell region.

10. The semiconductor device according to claim 1, wherein the super-junction structure is configured such that, in the cell region, the first-conductivity-type column regions and the second-conductivity-type column regions are repeatedly and alternately formed using a direction parallel with a plane in which the first-conductivity-type layer extends as a column longitudinal direction and using a direction perpendicular to the column longitudinal direction as a column repetition direction while, in the peripheral region, the second-conductivity-type column regions are formed in a multi-round frame shape surrounding a periphery of the cell region, and
wherein, in the peripheral region, one interval between the second-conductivity-type column regions configured in the multi round frame shape is larger than another interval between the second-conductivity-type column regions, the one interval being located farther from the cell region than the another interval in the peripheral region in a radial direction of the cell region.

11. A semiconductor device including a cell region in which a semiconductor element is formed, and a peripheral region surrounding the cell region, the semiconductor device comprising:
a semiconductor substrate including a first-conductivity-type layer, and first-conductivity-type column regions and second-conductivity-type column regions formed above the first-conductivity-type layer and serving as a drift region, the first-conductivity-type column regions and the second-conductivity-type column regions forming a super-junction structure, each of the first-conductivity-type column regions having a first-conductivity-type charge, each of the second-conductivity-type column regions having a second-conductivity-type charge, an amount of the first-conductivity-type charge per unit volume being defined as a first-conductivity-type charge amount, an amount of the second-conductivity-type charge per unit volume being defined as a second-conductivity-type charge amount, a part of the semiconductor substrate being included in the cell region and other part of the semiconductor substrate being included in the peripheral region, a first-conductivity-type charge amount and a second-conductivity-type charge amount in the super-junction structure being equal in the cell region, the semiconductor substrate further including a charge balance change region in the peripheral region, wherein, in the charge balance change region, the first-conductivity-type charge amount is larger than the second-conductivity-type charge amount, and a ratio of the first-conductivity-type charge amount to the second-conductivity-type charge amount in one section of the charge balance change region is larger than a ratio of the first-conductivity-type charge amount to the second-conductivity-type charge amount in another section of the charge balance change region, the one section being located farther from the cell region than the another section in the peripheral region in a radial direction of the cell region.

12. The semiconductor device according to claim 11,
wherein the super-junction structure is configured such that the first-conductivity-type column regions and the second-conductivity-type column regions are repeatedly and alternately formed using a direction parallel with a plane in which the first-conductivity-type layer extends as a column longitudinal direction and using a direction perpendicular to the column longitudinal direction as a column repetition direction, and
wherein each of the second-conductivity-type column regions has a front end portion in the column longitudinal direction, and the front end portion is formed in a taper shape having a tapering width such that a boundary surface with the first-conductivity-type column region becomes a taper shape inclined with respect to the column repetition direction.

13. The semiconductor device according to claim 12,
wherein, in the super-junction structure, widths of the second-conductivity-type column regions in the column repetition direction are equal in the cell region and the peripheral region,
wherein column pitches, which are repetition units of the first-conductivity-type column regions and the second-conductivity-type column regions, are equal in the cell region,
wherein the column pitches in the peripheral region are larger than the column pitches in the cell region, and
wherein, in the peripheral region, one of the column pitches is larger than another one of the column pitches, the one of the column pitches being located farther from the cell region than the another one of the column pitches in the peripheral region in the column repetition direction.

14. The semiconductor device according to claim 12,
wherein a width of one of the second-conductivity-type column regions is smaller than a width of another one of the second-conductivity-type column regions, the one of the second-conductivity-type column regions being located farther from the cell region than the another one of the second-conductivity-type column regions in the column repetition direction, and
wherein column pitches, which are repetition units of the first-conductivity-type column regions and the second-conductivity-type column regions, are equal in the cell region and the peripheral region.

15. The semiconductor device according to claim 12,
wherein a depth of one portion in each of the second-conductivity-type column regions is smaller than a depth of another portion in each of the second-conductivity-type column regions, the one portion being located farther from the cell region than the another portion in each of the second-conductivity-type column regions in the column longitudinal direction.

16. The semiconductor device according to claim 11,
wherein, in the peripheral region, a first-conductivity-type impurity concentration per unit volume of one portion in each of the first-conductivity-type column regions is larger than a first-conductivity-type impurity concentration per unit volume of another portion in each of the first-conductivity-type column regions, the one portion being farther from the cell region than the another portion in each of the first-conductivity-type column regions.

17. The semiconductor device according to claim 11,
wherein the super-junction structure is configured such that, in the cell region, the first-conductivity-type column regions and the second-conductivity-type column regions are repeatedly and alternately formed using a direction parallel with a plane in which the first-conductivity-type layer extends as a column longitudinal direction and using a direction perpendicular to the column longitudinal direction as a column repetition direction while, in the peripheral region, the second-conductivity-type column regions are configured in a multi-round frame shape surrounding a periphery of the cell region, and
wherein, in the peripheral region, one interval between the second-conductivity-type column regions configured in the multi round frame shape is larger than another interval between the second-conductivity-type column regions, the one interval being located farther from the cell region than the another interval in the peripheral region in a radial direction of the cell region.

18. The semiconductor device according to claim 11,
wherein the super-junction structure is configured such that the second-conductivity-type column regions are scattered in a dotted shape in the first-conductivity-type column region, and wherein a ratio between the peripheral region and the first-conductivity-type regions formed in the peripheral region is lower than a ratio between the cell region and the first-conductivity-type regions formed in the cell region, and wherein a ratio between the peripheral region and the first-conductivity-type regions in the one section of the peripheral region is lower than a ratio between the peripheral region and the first-conductivity-type regions in the another section of the peripheral region, the one section being located farther from the cell region than the another section in the peripheral region in a radial direction of the cell region.

19. The semiconductor device according to claim 11, wherein the super-junction structure includes a charge balance change structure in which a ratio of the first-conductivity-type charge amount to the second-conductivity-type amount of one section of the charge balance change structure is larger than a ratio of the first-conductivity-type charge amount to the second-conductivity type charge amount of another section of the charge balance change structure, the one section being located deeper than the another section, and wherein when a repetition unit of the first-conductivity-type column regions and the second-conductivity-type column regions is defined as a column pitch and an excess concentration N is given by the excess concentration N=(the second-conductivity-type charge amount−the first-conductivity-type charge amount)/the column pitch), a concentration change gradient $dN/dx = (N1-N2)/x$ of the excess concentration in the charge balance change region toward the outer peripheral direction when N1 is the excess concentration at an innermost peripheral position in the charge balance change region, N2 is the excess concentration at an outermost peripheral position in the charge balance change region extending from the cell region toward the outer peripheral direction, and x is a distance from the innermost peripheral position to the outermost peripheral position in the charge balance change region and a concentration change gradient $dN/dz=(N3-N4)/z$ of the excess concentration in the depth direction in the charge balance change structure when N3 is the excess concentration at a surface position in the cell region, N4 is the excess concentration at a deepest position in the cell region, and z is a distance from the surface position to the deepest position in the cell region to satisfy a relationship of $dN/dx \leq dN/dz$.

20. The semiconductor device according to claim 19, wherein the excess concentration N2 at the outer periphery of the peripheral region and the excess concentration N4 at the deepest position in the cell region satisfy a relationship of N2>N4.

* * * * *